US007898048B2

(12) United States Patent
Nakatani

(10) Patent No.: US 7,898,048 B2
(45) Date of Patent: Mar. 1, 2011

(54) MEMS SENSOR

(75) Inventor: Goro Nakatani, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 68 days.

(21) Appl. No.: 12/219,448

(22) Filed: Jul. 22, 2008

(65) Prior Publication Data

US 2009/0278216 A1 Nov. 12, 2009

(30) Foreign Application Priority Data

Jul. 24, 2007 (JP) ............................ 2007-192203

(51) Int. Cl.
*H01L 29/84* (2006.01)

(52) U.S. Cl. ............................ 257/416; 257/E29.324; 438/157

(58) Field of Classification Search .......... 257/415–430
See application file for complete search history.

(56) References Cited

U.S. PATENT DOCUMENTS 7,538,471 B2 * 5/2009 Kurozuka et al. ........... 310/309
2008/0247573 A1 * 10/2008 Pedersen .................... 381/174
2009/0134492 A1 * 5/2009 Morris et al. ............... 257/532

FOREIGN PATENT DOCUMENTS

JP 2007124306 A * 5/2007
WO WO 98/37388 8/1998

OTHER PUBLICATIONS

Machine translation of JP 2007124306 A.*

* cited by examiner

*Primary Examiner*—N Drew Richards
*Assistant Examiner*—Mamadou Diallo
(74) *Attorney, Agent, or Firm*—Rabin & Berdo, PC

(57) ABSTRACT

An MEMS sensor is described. The MEMS sensor may include a substrate, a lower thin film provided in contact with a surface of the substrate, and an upper thin film opposed to the lower thin film at an interval on the side opposite to the substrate.

11 Claims, 29 Drawing Sheets

1

MEMS SENSOR

BACKGROUND OF THE INVENTION

1. Field of the Invention

The present invention relates to an MEMS sensor.

2. Description of Related Art

In recent years, an MEMS sensor such as an Si (silicon) microphone produced by MEMS (Micro Electro Mechanical Systems) has been employed as a microphone loaded on a portable telephone or the like.

FIGS. 5A to 5K are schematic sectional views successively showing the steps of producing a conventional Si microphone 101. The method of producing the conventional Si microphone 101 and the structure thereof are now described with reference to FIGS. 5A to 5K.

In order to produce the conventional Si microphone 101, $SiO_2$ (silicon oxide) is deposited on the overall surfaces of an Si wafer W2 by thermal oxidation, as shown in FIG. 5A. Thus, a lower sacrificial layer 111 made of $SiO_2$ is formed on the upper surface of the Si wafer W2. Further, an $SiO_2$ film 119 is formed on the lower surface of the Si wafer W2.

Then, a photoresist film 120 having holes 121 of a prescribed pattern is formed on the upper surface of the lower sacrificial layer 111, as shown in FIG. 5B. The lower sacrificial layer 111 is etched through the photoresist film 120 employed as a mask, whereby a plurality of (four in FIG. 5C) recesses 112 are formed in the upper surface of the lower sacrificial layer 111, as shown in FIG. 5C. After the formation of the recesses 112, the photoresist film 120 is removed.

Then, polysilicon is deposited on the overall surfaces of the lower sacrificial layer 111 and the $SiO_2$ film 119 by LPCVD (Low Pressure Chemical Vapor Deposition). The polysilicon film covering the lower sacrificial layer 111 is doped with phosphorus, and thereafter portions of this polysilicon film other than that present on a prescribed region including the plurality of recesses 112 are removed by well-known photolithography and etching. Thus, a thin-film polysilicon plate 104 is formed on the prescribed region of the lower sacrificial layer 111, as shown in FIG. 5D. Further, a polysilicon film 113 is formed on the $SiO_2$ film 119.

Then, $SiO_2$ is deposited on the overall surfaces of the lower sacrificial layer 111 and the polysilicon plate 104 by PECVD (Plasma Enhanced Chemical Vapor Deposition). Then, unnecessary portions of the deposited $SiO_2$ film are removed by well-known photolithography and etching. Thus, an upper sacrificial layer 114 made of $SiO_2$ is formed on the polysilicon plate 104 and a region around the same, as shown in FIG. 5E.

Then, polysilicon is deposited on the lower sacrificial layer 111, the upper sacrificial layer 114 and the polysilicon film 113 by LPCVD (Low Pressure Chemical Vapor Deposition). Thus, the polysilicon film deposited on the polysilicon film 113 and the polysilicon film 113 are integrated into a polysilicon film 115, as shown in FIG. 5F. On the other hand, the polysilicon film deposited on the lower sacrificial layer 111 and the upper sacrificial layer 114 is doped with phosphorus, and thereafter patterned by well-known photolithography and etching. Thus, a thin-film back plate 105 having a large number of holes 106 is formed on the upper sacrificial layer 114, as shown in FIG. 5F.

Then, a photoresist film 122 having holes 123 of a prescribed pattern is formed on the overall region of the upper sacrificial layer 114 including the back plate 105, as shown in FIG. 5G. Then, the upper sacrificial layer 114 is etched through the photoresist film 122 employed as a mask. Thus, a plurality of (four in FIG. 5H) recesses 117 are formed in the upper surface of the upper sacrificial layer 114 while unnecessary portions (other than the portion opposed to the upper sacrificial layer 114) of the lower sacrificial layer 111 are removed, as shown in FIG. 5H. After the formation of the recesses 117, the photoresist film 122 is removed.

Then, the polysilicon film 115 is removed, and an SiN (silicon nitride) film 107 is thereafter formed on the upper region of the Si wafer W2 by PECVD, as shown in FIG. 5I.

Then, holes 118 communicating with the holes 106 of the back plate 105 respectively are formed in the SiN film 107 by well-known photolithography and etching, as shown in FIG. 5J. Thus, the upper sacrificial layer 114 is partially exposed through the holes 106 and 118. Further, an opening is formed in the portion of the $SiO_2$ film 119 opposed to the polysilicon plate 104 by well-known photolithography and etching. Then, the Si wafer W2 is etched through this opening, so that a through-hole 103 is formed in the Si wafer W2. Consequently, the lower sacrificial layer 111 is partially exposed through the through-hole 103.

Then, an etching solution capable of etching $SiO_2$ is supplied through the through-hole 103 and the holes 106 and 118, to wet-etch the upper sacrificial layer 114 and the lower sacrificial layer 111. Thus, a cavity 124 of a small interval is formed between the Si wafer W2 and the polysilicon plate 104 and the polysilicon plate 104 floats up from the upper surface of the Si wafer W2, as shown in FIG. 5K. Further, a cavity 110 of a small interval is formed between the polysilicon plate 104 and the back plate 105, and the back plate 105 floats up from the upper surface of the polysilicon plate 104.

Thereafter the Si wafer W2 is divided into an Si substrate 102 of each device size, whereby the Si microphone 101 is obtained with the polysilicon plate 104 and the back plate 105 opposed to each other through the cavity 110. Portions of the SiN film 107 having entered the recesses 117 of the upper sacrificial layer 114 become protrusions 109 protruding toward the polysilicon plate 104, to function as stoppers for preventing the polysilicon plate 104 and the back plate 105 from adhesion and a short circuit. Further, portions of the polysilicon plate 104 having entered the recesses 112 of the lower sacrificial layer 111 become protrusions 108 protruding toward the upper surface of the Si wafer W2, to function as stoppers for preventing the Si substrate 102 and the polysilicon plate 104 from adhesion. The polysilicon plate 104 and the back plate 105 are supported by unshown wires.

The polysilicon plate 104 and the back plate 105 form a capacitor portion 125 opposed through the cavity 110. When a sound pressure (sound wave) is input in the Si microphone 101 from the through-hole 103, the polysilicon plate 104 and the back plate 105 vibrate due to this sound pressure (sound wave), and the Si microphone 101 outputs an electric signal responsive to a change of the capacitance of the capacitor portion 125 resulting from this vibration of these plates 104 and 105.

In the Si microphone 101, however, both of the polysilicon plate 104 and the back plate 105 vibrate due to the sound pressure (sound wave) input from the through-hole 103, and hence the input sound wave may resonate.

Further, the cavity 124 is formed between the Si substrate 2 and the polysilicon plate 104, and the cavity 110 is formed between the polysilicon plate 104 and the back plate 105, while the polysilicon plate 104 and the back plate 105 are supported by the unshown wires to be in the states floating in the air respectively. In the Si microphone 101, therefore, the structure of the capacitor portion 125 is complicated, and the shock resistance of the capacitor portion 125 is not sufficient.

In order to form the two cavities (110 and 124) in the capacitor portion 125, the two steps including the step of forming the lower sacrificial layer 111 (see FIG. 5A) and the step of forming the upper sacrificial layer 114 (see FIG. 5E) are required as those of forming sacrificial layers for forming the cavities. In order to reduce the time necessary for removing the upper sacrificial layer 114 and the lower sacrificial layer 111, further, the through-hole 103 is formed in the Si wafer W2 and the etching solution is supplied through the through-hole 103 and the holes 106 and 118, thereby progressing the etching of the lower sacrificial layer 111 in parallel with the etching of the upper sacrificial layer 114. In order to form the through-hole 103 in the Si wafer W2, however, an opening must be formed in the $SiO_2$ film 119 provided on the lower surface of the Si wafer W2, for etching the Si wafer W2 from this opening. In other words, two steps including those of forming the opening in the $SiO_2$ film 119 and etching the Si wafer W2 must unavoidably be added. Consequently, the steps of producing the Si microphone 1 are disadvantageously complicated.

SUMMARY OF THE INVENTION

One aspect of the present invention may provide an MEMS sensor capable of inhibiting an input sound wave from resonance in a simple structure.

The same or different aspect of the present invention may provide an MEMS sensor allowing simplification of the steps of producing the same.

The same or different aspect of the present invention may provide an MEMS sensor including: a substrate; a lower thin film provided in contact with a surface of the substrate; and an upper thin film opposed to the lower thin film at an interval on the side opposite to the substrate.

According to this structure, the upper thin film is opposed to the lower thin film provided in contact with the surface of the substrate at the interval on the side opposite to the substrate. The upper thin film and the lower thin film form a capacitor portion opposed through a cavity of a prescribed interval.

In this MEMS sensor, the lower thin film is provided in contact with the surface of the substrate. When a sound pressure (sound wave) is input in the capacitor portion, therefore, the lower thin film remains unvibrating, and the capacitor portion outputs an electric signal responsive to a change of the capacitance of the capacitor portion resulting from vibration of the upper thin film. The upper and lower thin films do not simultaneously vibrate upon the input of the sound pressure (sound wave) in the capacitor portion, whereby the input sound wave can be inhibited from resonance. Further, the lower thin film is provided in contact with the substrate, and no cavity is formed between the lower thin film and the substrate. Therefore, the structure of the capacitor portion is simple, and the shock resistance of the capacitor portion can be improved.

The MEMS sensor has no cavity between the substrate and the lower thin film, whereby no sacrificial layer may be formed between a wafer employed as the matrix for the substrate and the lower thin film for forming a cavity in the steps of producing the MEMS sensor. Further, no through-hole may be formed in the wafer for removing such a sacrificial layer from a space between the wafer and the lower thin film. Therefore, the steps of producing the MEMS sensor can be simplified.

A plurality of lower through-holes are preferably formed in the lower thin film to pass through the lower thin film in the thickness direction thereof, and the upper thin film is preferably provided with upper protrusions formed integrally with the upper thin film to protrude toward the lower through-holes from the surface of the upper thin film opposed to the lower thin film.

The lower thin film has the plurality of lower through-holes, whereby a sacrificial layer material (SiN (silicon nitride), Al (aluminum) or $SiO_2$ (silicon oxide), for example) employed as the material for a sacrificial layer enters the lower through-holes when the sacrificial layer for forming a cavity is formed on the lower thin film. Therefore, portions of the sacrificial material entering the lower through-holes (portions of the sacrificial layer opposed to the lower through-holes) are dented to form recesses in the upper surface of the sacrificial layer. The recesses are so formed in the sacrificial layer that the upper thin film formed on the sacrificial layer partially enters the recesses of the sacrificial layer. Then, the sacrificial layer is so removed that the portions of the upper thin film having entered the recesses of the sacrificial layer become the upper protrusions protruding toward the lower through-holes.

The upper protrusions are so formed on the upper thin film as to come into contact with the lower thin film when the upper and lower thin films are attracted to each other due to electrostatic force or the like, whereby the upper and lower thin films can be prevented from coming into contact with each other over a wide contact area. Consequently, the upper and lower thin films can be prevented from adhering to each other.

Also according to such a structure that lower protrusions protruding toward the upper thin film are formed on the surface of the lower thin film opposed to the upper thin film, the upper and lower thin films can be prevented from adhering to each other.

DETAILED DESCRIPTION OF THE INVENTION

Figure 1:
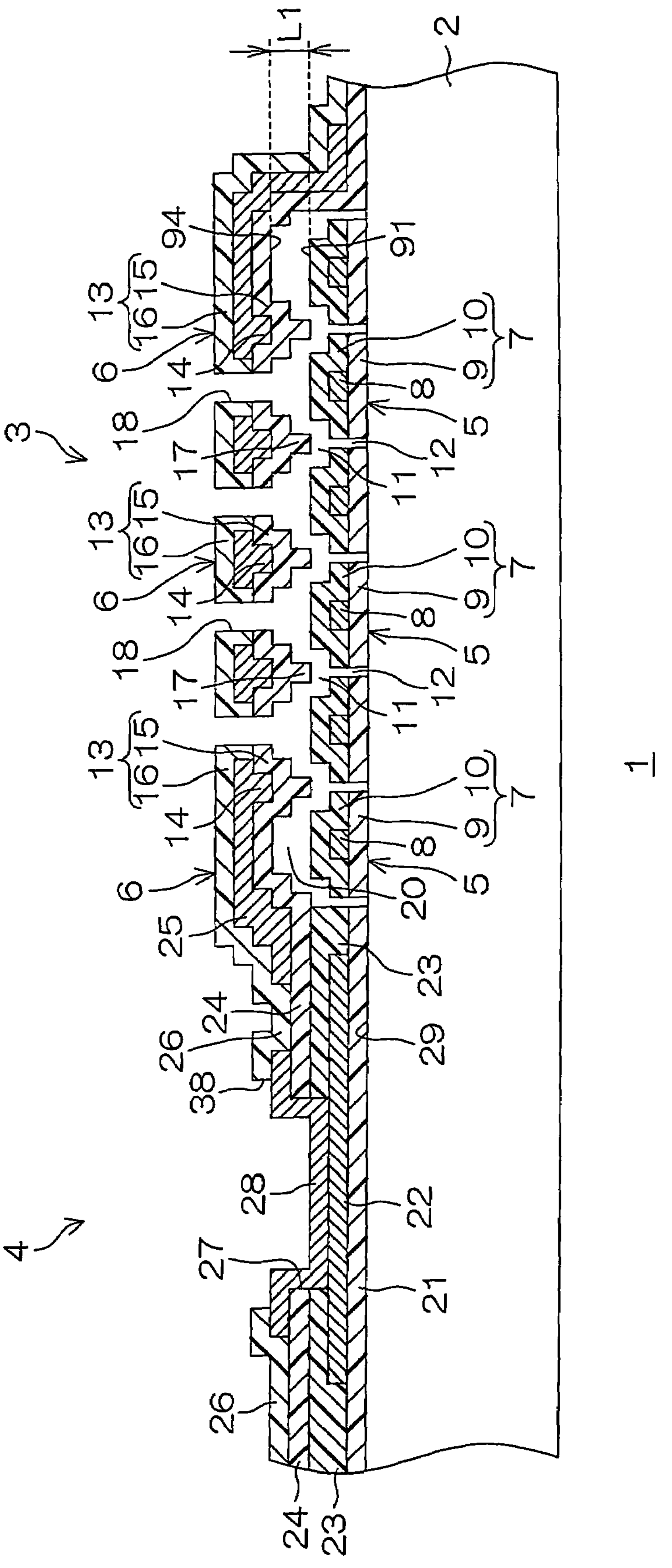
FIG. 1 is a schematic sectional view of an Si microphone according to a first embodiment of the present invention.

FIG. 1 is a schematic sectional view of an Si microphone 1 according to a first embodiment of the present invention.

The Si microphone 1 is a capacitance type sensor (MEMS sensor) operating by sensing a change in capacitance. This Si microphone 1 has a sensor portion 3 and a pad portion 4 on an Si substrate 2.

The sensor portion 3 senses a sound pressure input in the Si microphone 1, and outputs a change of capacitance responsive to the magnitude of the sound pressure to a wire 22 (described later) as an electric signal.

The sensor portion 3 includes a lower thin film 5 provided in contact with a surface (hereinafter referred to as an upper surface 29) of the Si substrate 2 and an upper thin film 6 arranged above the lower thin film 5 to be opposed thereto at an interval.

The lower thin film 5 includes a lower thin film insulating layer 7 and a lower electrode 8 covered with the lower thin film insulating layer 7.

The lower thin film insulating layer 7 includes a first insulating layer 9 forming a lower layer of the lower tin film insulating layer 7 and a second insulating layer 10 formed on the first insulating layer 9 as an upper layer of the lower thin film insulating layer 7.

The first insulating layer 9 is formed integrally with a first insulating layer 21 (described later) of the pad portion 4.

The second insulating layer 10 is formed integrally with a second insulating layer 23 (described later) of the pad portion 4. A plurality of recesses 11 are formed in the second insulating layer 10. The plurality of recesses 11 are arranged in the form of a matrix with m rows and n columns (m and n denote natural numbers) as a whole, for example.

The lower thin film insulating layer 7 is provided with lower through-holes 12 passing through the lower thin film insulating layer 7 in the thickness direction thereof from the bottom surfaces of the recesses 11. Thus, the lower thin film insulating layer 7 is in the form of a rectangular mesh in plan view, with the lower through-holes 12 provided in the form of a matrix in plan view.

The lower electrode 8 is made of a conductive material such as Au or Al, for example, and Al is applied in this embodiment. The lower electrode 8 is in the form of a rectangular mesh in plan view. This lower electrode 8 is arranged on the upper surface of the first insulating layer 9. The side surfaces and the upper surface of the lower electrode 8 are covered with the second insulating layer 10. In other words, the lower electrode 8 is held between the lower first insulating layer 9 and the upper second insulating layer 10 in the lower thin film 5, so that the overall surfaces thereof are covered with the lower thin film insulating layer 7. The second insulating layer 10 is so formed on the mesh lower electrode 8 that the surface thereof protuberates on portions opposed to the lower electrode 8 and has the recesses 11 in portions not opposed to the lower electrode 8.

The upper thin film 6 includes an upper thin film insulating layer 13 and an upper electrode 14 covered with this upper thin film insulating layer 13.

The upper thin film insulating layer 13 includes a third insulating layer 15 forming a lower layer of the upper thin film insulating layer 13 and a fourth insulating layer 16 formed on the third insulating layer 15 as an upper layer of the upper thin film insulating layer 13.

The third insulating layer 15 is formed integrally with a third insulating layer 24 (described later) of the pad portion 4. The third insulating layer 15 is provided with protrusions 17 (upper protrusions) protruding toward the recesses 11 (lower through-holes 12) on portions opposed to the recesses 11 (lower through-holes 12) in a lower surface 94 (surface opposed to the lower thin film) opposed to the lower thin film 5.

The fourth insulating layer 16 is formed integrally with a fourth insulating layer 26 (described later) of the pad portion 4.

The upper thin film insulating layer 13 is provided with a plurality of upper through-holes 18 passing through the upper thin film insulating layer 13 in the thickness direction thereof.

The upper through-holes 18 are arranged on positions (between the adjacent ones of the lower through-holes 12 in plan view, for example) deviating from the lower through-holes 12 respectively.

The upper electrode 14 is made of a conductive material such as Au or Al, for example, and Al is applied in this embodiment. The upper electrode 14 is in the form of a rectangular mesh in plan view. This upper electrode 14 is arranged on the third insulating layer 15. The side surfaces and the upper surface of the upper electrode 14 are covered with the fourth insulating layer 16. In other words, the upper electrode 14 is held between the lower third insulating layer 15 and the upper fourth insulating layer 16 in the upper thin film 6, so that the overall surfaces thereof are covered with the upper thin film insulating layer 13. The upper electrode 14 is supported by a wire 25 (described later) at a prescribed interval from the upper surface of the lower thin film 5 (upper surface 91 of the second insulating layer 10). Thus, the upper thin film 6 formed by covering the upper electrode 14 with the upper thin film insulating layer 13 is opposed to the lower thin film 5 through a cavity 20 of a small interval L1 (the distance between the upper surface 91 of the second insulating layer 10 and the lower surface 94 of the third insulating layer 15 is 4 μm, for example).

The upper thin film 6 is opposed to the lower thin film 5 through the cavity 20 of the small interval L1, and forms the sensor portion 3 of a capacitor structure whose capacitance changes due to vibration, along with the lower thin film 5. In other words, when a sound pressure (sound wave) is input in the sensor portion 3, the upper thin film 6 vibrates due to this sound pressure, and the sensor portion 3 outputs an electric signal responsive to a change of the capacitance of the capacitor structure resulting from this vibration of the upper thin film 6 to the wire 22 (described later).

The pad portion 4 outputs the electric signal received from the sensor portion 3 to an external wire.

The pad portion 4 includes the first insulating layer 21, the wire 22, the second insulating layer 23, the third insulating layer 24, the wire 25 and the fourth insulating layer 26.

The first insulating layer 21 is formed on the upper surface 29 of the Si substrate 2.

The wire 22 is formed on the first insulating layer 21 in a prescribed pattern. The wire 22 is formed integrally with the lower electrode 8 and electrically connected with the wire 25 on an unshown position.

The second insulating layer 23 is formed on the first insulating layer 21, and covers the wire 22 along with the first insulating layer 21.

The third insulating layer 24 is formed on the second insulating layer 23.

The wire 25 is formed on the third insulating layer 24 in a prescribed pattern. The wire 25 is formed integrally with the upper electrode 14, and electrically connected with the wire 22 on an unshown position.

The second and third insulating layers 23 and 24 are provided with an opening 27 passing through these layers 23 and 24 in the thickness direction thereof. The opening 27 is formed to partially expose the wire 22 as a bonding pad.

A metal thin film 28 covering the part of the wire 22 exposed from the opening 27 is formed on the opening 27. The metal thin film 28 is made of a conductive material such as Au or Al, for example, and Al is applied in this embodiment. An electric wire (not shown) for electrically connecting the Si microphone 1 with an external IC chip (not shown) processing the electric signal, for example, is connected to the metal thin film 28.

The fourth insulating layer 26 is formed on the third insulating layer 24. The fourth insulating layer 26 is provided with an opening 38 partially exposing the metal thin film 28.

FIGS. 2A to 2H are schematic sectional views successively showing the steps of producing the Si microphone 1 shown in FIG. 1.

Figure 2A:
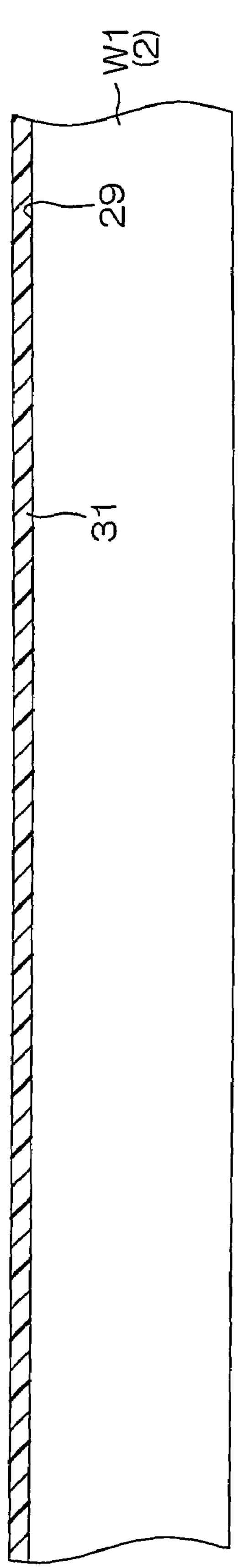
FIGS. 2A to 2H are schematic sectional views successively showing the steps of producing the Si microphone shown in FIG. 1.

In order to produce the Si microphone 1, $SiO_2$ is deposited on a surface (upper surface 29) of a discoidal Si wafer W1 forming the matrix of the Si substrate 2 by PECVD (Plasma Enhanced Chemical Vapor Deposition), for example. Thus, a first insulating layer 31 made of $SiO_2$ is formed on the upper surface 29 of the Si wafer W1, as shown in FIG. 2A.

Figure 2B:
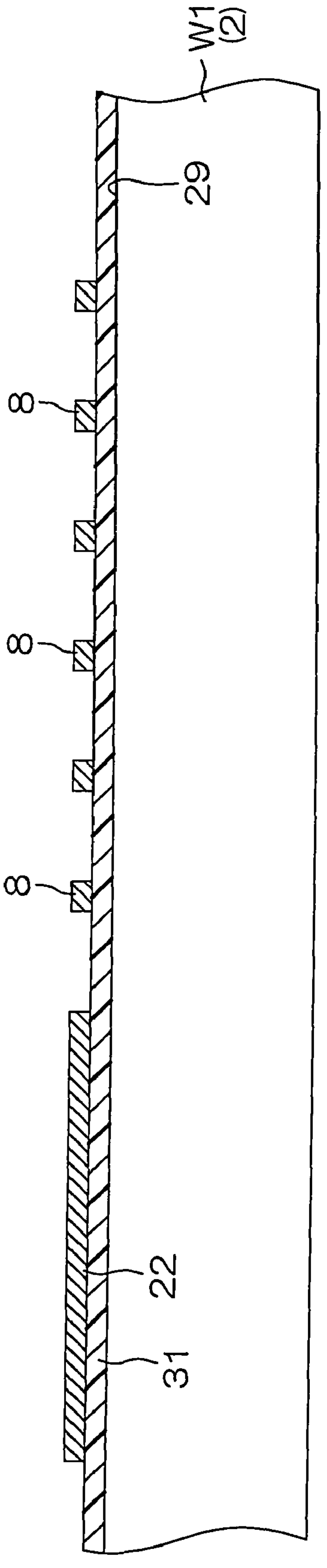

Then, an Al film is formed on the overall region of the first insulating layer 31 by sputtering, for example. Then, this Al film is patterned by well-known photolithography and etching. Thus, the lower electrode 8 in the form of a mesh in plan view and the wire 22 of the prescribed pattern are formed on the upper surface of the first insulating layer 31, as shown in FIG. 2B.

Figure 2C:
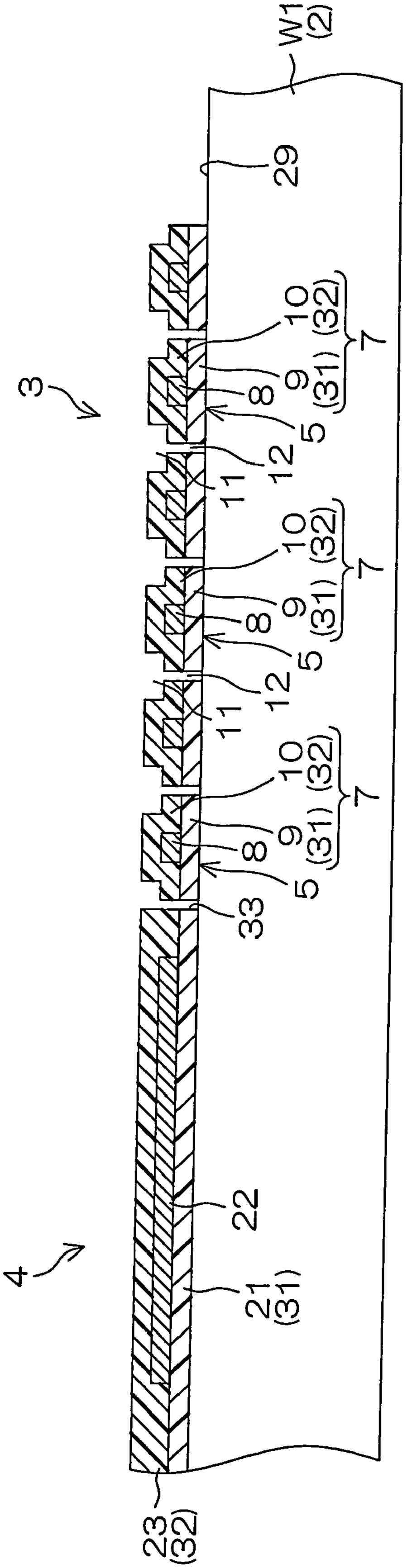

Then, a second insulating layer 32 is formed on the overall region of the first insulating layer 31 including the wire 22 and the lower electrode 8 by PECVD, for example. At this time, portions of the second insulating layer 32 (second insulating layer 10) located on the lower electrode 8 protrude by the thickness of the lower electrode 8, whereby the recesses 11 are formed between the adjacent ones of the protruding portions. Then, the second insulating layer 32 and the first insulating layer 31 are patterned by well-known photolithography and etching, to form a clearance 33 dividing the structure provided on the Si substrate 2 into the sensor portion 3 and the pad portion 4. In the first and second insulating layers 31 and 32 of the sensor portion 3, the lower through-holes 12 are formed by this patterning to extend from the bottom surfaces of the recesses 11 toward the Si substrate 2 in the thickness direction. Thus, the first insulating layer 31 in the sensor portion 3 becomes the first insulating layer 9, and the portion of the second insulating layer 32 located on the first insulating layer 9 becomes the second insulating layer 10. The lower thin film 5 having the structure obtained by covering the lower electrode 8 with the lower thin film insulating layer 7 consisting of the first and second insulating layers 9 and 10 is formed on the lower sacrificial layer 30 in this manner, as shown in FIG. 2C.

On the other hand, the first insulating layer 31 in the pad portion 4 becomes the first insulating layer 21, and the portion of the second insulating layer 32 located on the first insulating layer 21 becomes the second insulating layer 23 covering the wire 22 along with the first insulating layer 21.

Figure 2D:
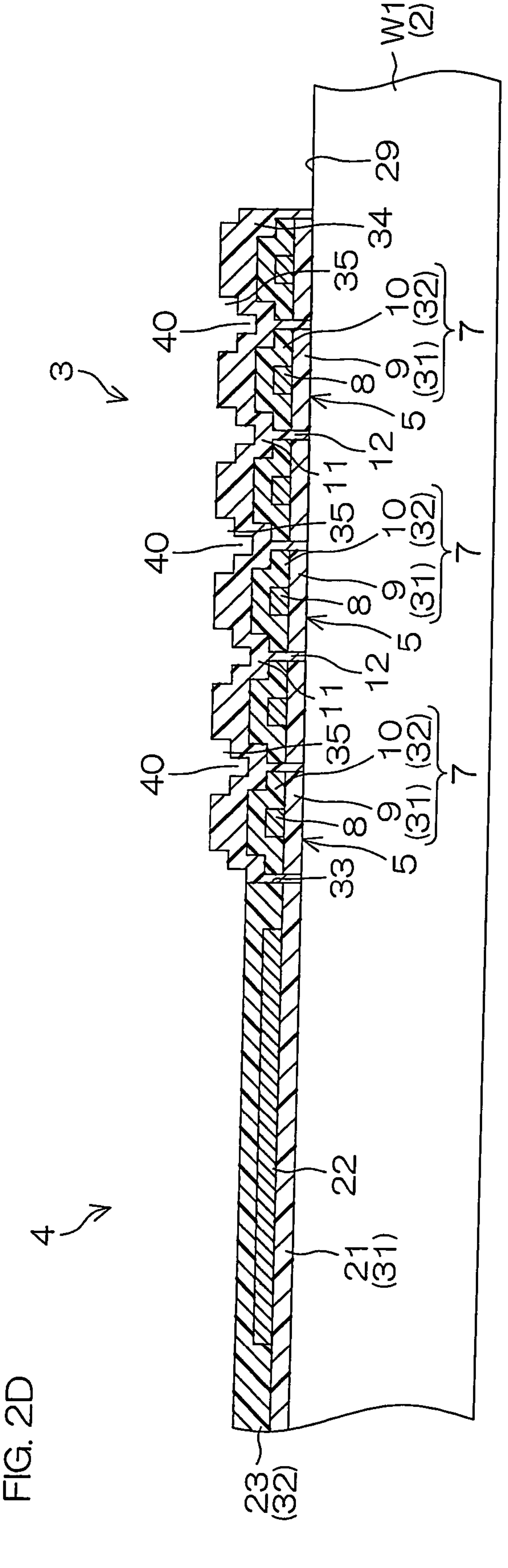

Then, Al is deposited on the overall region of the Si wafer W1 by PECVD, for example. This Al is deposited up to a height for filling up the lower through-holes 12 and the clearance 33 and completely covering the lower thin film 5. Then, this Al film is patterned by well-known photolithography and etching. Thus, a sacrificial layer 34 made of Al is formed as shown in FIG. 2D. At this time, recesses 35 are formed in the sacrificial layer 34 on positions opposed to the recesses 11, due to the recesses 11 formed in the second insulating layer 10 of the lower thin film 5. Further, recesses 40 dented from the bottom surfaces of the recesses 35 by one step are formed in the sacrificial layer 34, due to the lower through-holes 12 formed in the lower thin film insulating layer 7.

Figure 2E:
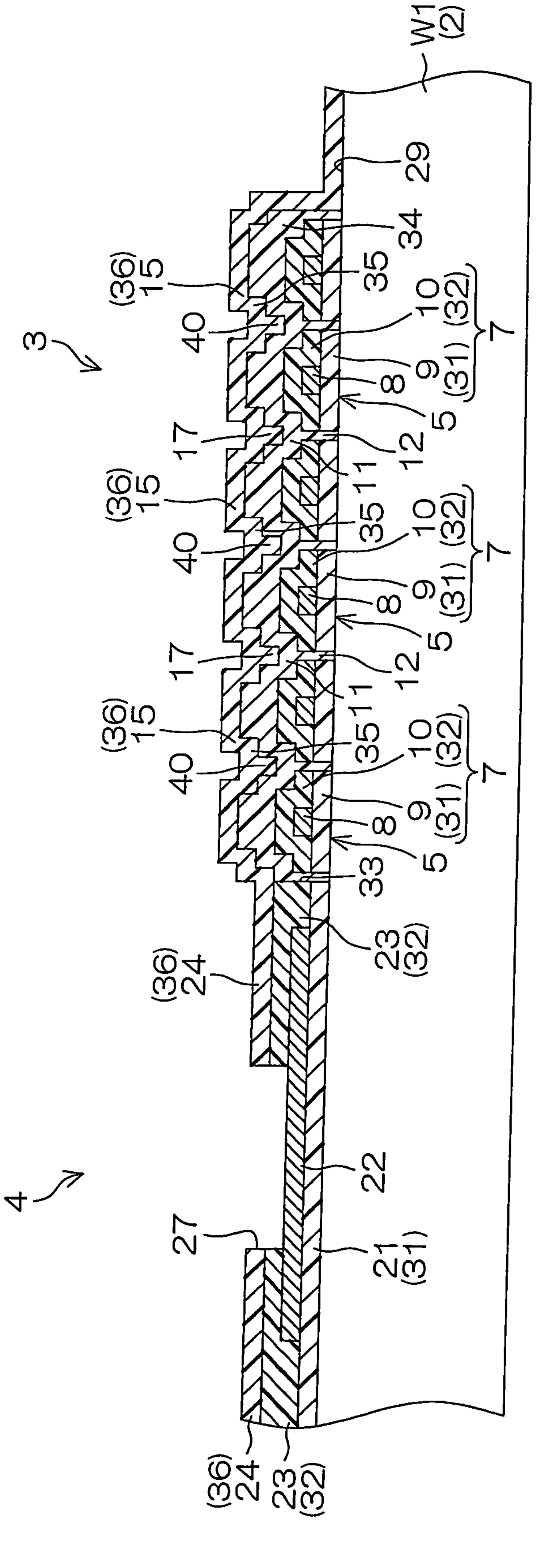

After the formation of the sacrificial layer 34, $SiO_2$ is deposited on the overall region of the Si wafer W1 including the sacrificial layer 34 by PECVD, for example. This $SiO_2$ is deposited up to a height for entering the recesses 40 and 35 and completely covering the sacrificial layer 34. Thus, a third insulating layer 36 is formed by the third insulating layer 15 provided on the sacrificial layer 34 and the third insulating layer 24 provided on the second insulating layer 23, as shown in FIG. 2E. Thereafter the third insulating layer 24 and the second insulating layer 23 are partially removed by well-known photolithography and etching, for forming the opening 27 partially exposing the wire 22 as the bonding pad.

Figure 2F:
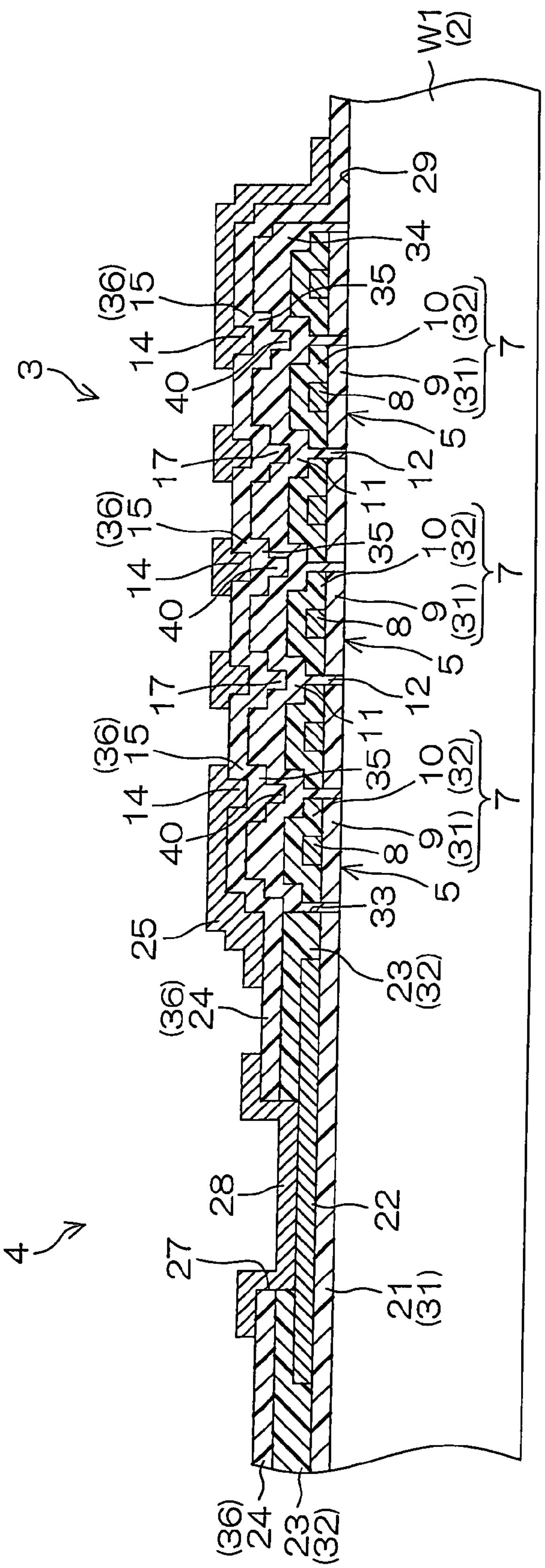

Then, an Al film is formed on the overall region of the third insulating layer 36 by sputtering, for example. Then, the Al film is patterned by well-known photolithography and etching. Thus, the upper electrode 14 in the form of a mesh in plan view is formed on a position of the upper surface of the third insulating layer 15 opposed to the lower thin film 5 through the sacrificial layer 34, as shown in FIG. 2F. On the other hand, the wire 25 of the prescribed pattern is formed on the upper surface of the third insulating layer 24. Further, the metal thin film 28 covering the part of the wire 22 exposed from the opening 27 is formed on the opening 27.

Figure 2G:
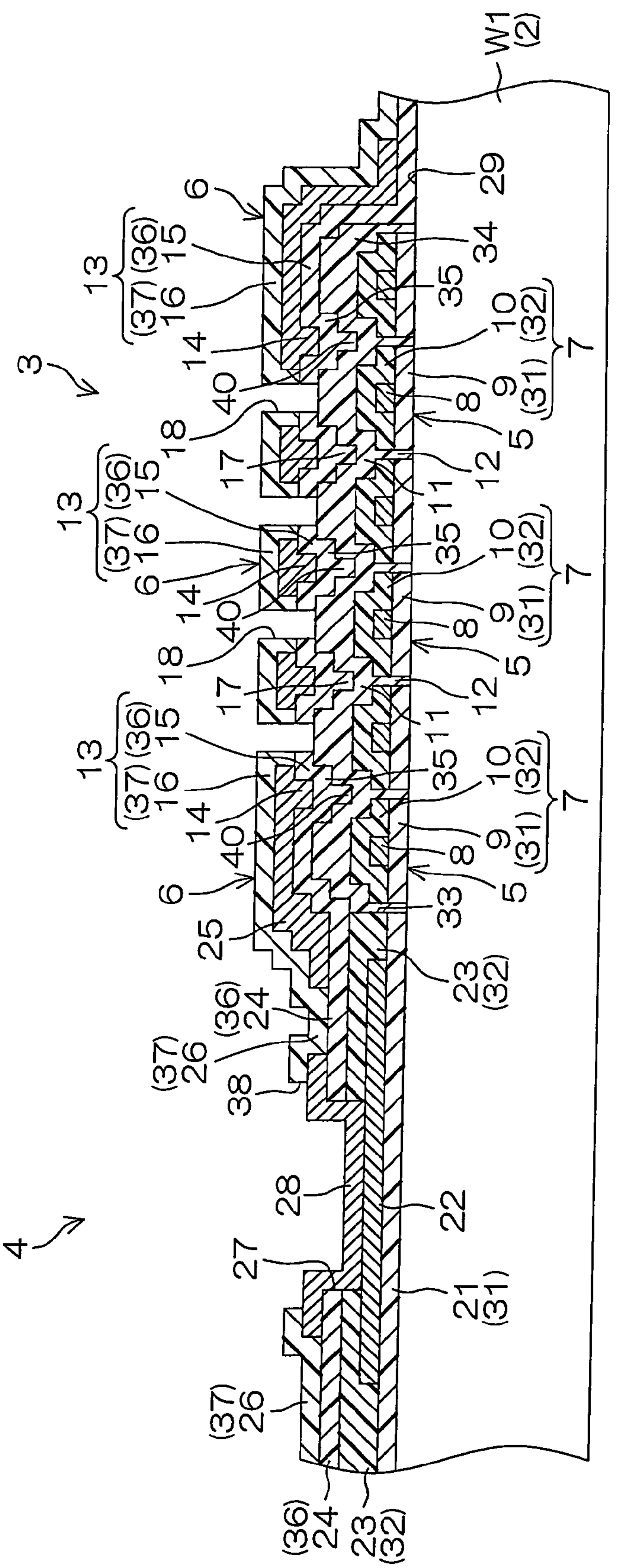

Then, $SiO_2$ is deposited on the overall region of the third insulating layer 36 including the upper electrode 14, the wire 25 and the metal thin film 28 by PECVD, for example. Thus, a fourth insulating layer 37 is formed by the fourth insulating layer 16 provided on the third insulating layer 15 and the fourth insulating layer 26 provided on the third insulating layer 24. Then, the fourth insulating layer 37 and the third insulating layer 36 are patterned by well-known photolithography and etching. Thus, the upper through-holes 18 arranged on the positions deviating from the lower through-holes 12 are formed in the fourth insulating layer 16 and the third insulating layer 15 to extend in the thickness direction thereof up to the sacrificial layer 34, as shown in FIG. 2G. The upper thin film 6 having the structure obtained by covering the upper electrode 14 with the upper thin film insulating layer 13 consisting of the third and fourth insulating layers 15 and 16 is formed on the lower thin film 5 in this manner. Further, the opening 38 partially exposing the metal thin film 28 is formed in the fourth insulating layer 26.

Figure 2H:
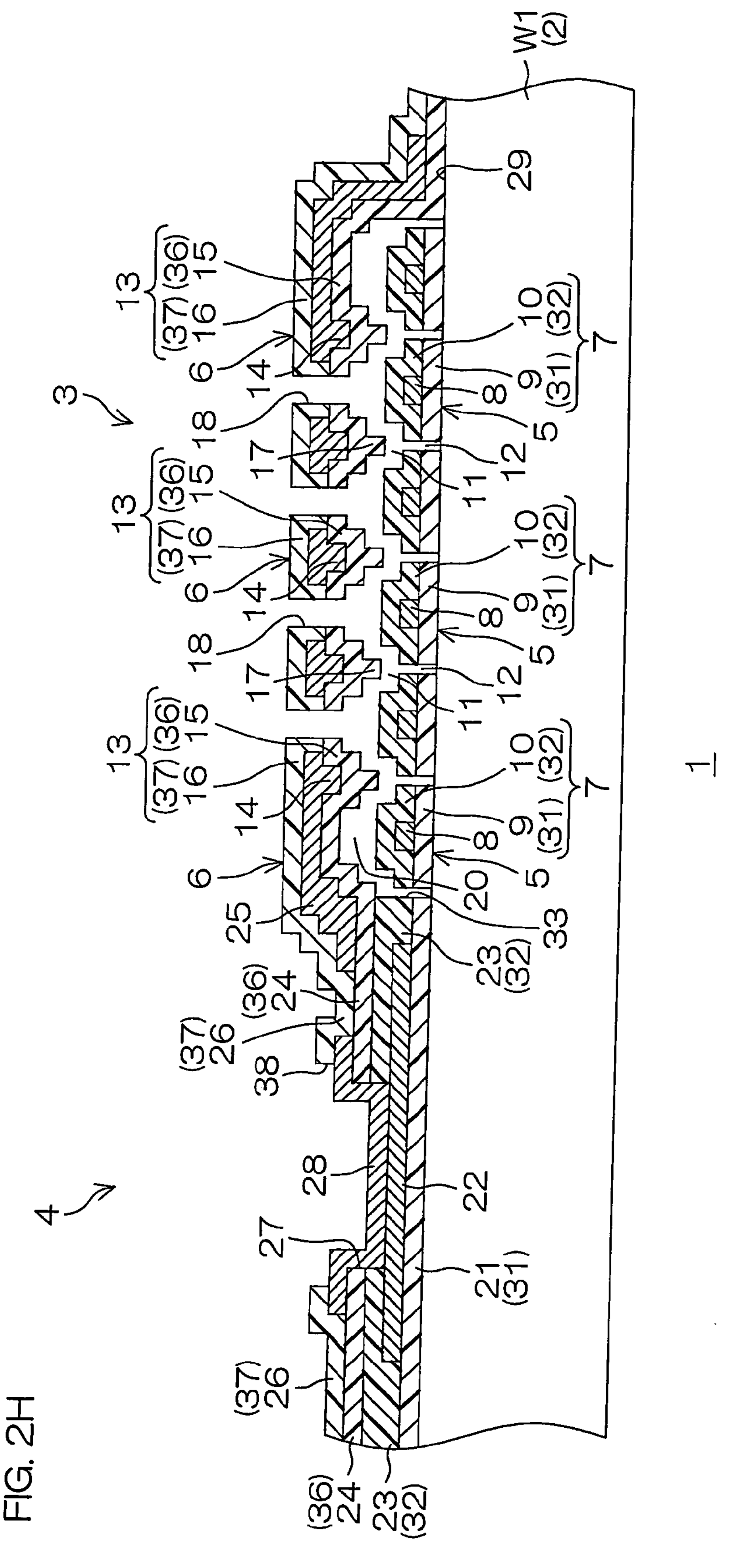

Thereafter etching gas (chlorine-based gas such as $BCl_3$ (boron trichloride), for example) is supplied to the sacrificial layer 34 through the upper through-holes 18, to dry-etch the sacrificial layer 34. Thus, the sacrificial layer 34 is removed and the cavity 20 is formed between the lower thin film 5 and the upper tin film 6, as shown in FIG. 2H.

Then, the Si wafer W1 is divided into the size of the Si substrate 2, whereby the Si microphone 1 shown in FIG. 1 is obtained. The portions of the third insulating layer 15 having entered the recesses 35 and 40 of the sacrificial layer 34 become the protrusions 17 protruding toward the recesses 11 (lower through-holes 12), to function as the stoppers for preventing the upper thin film 6 and the lower thin film 5 from adhesion.

According to the first embodiment, as hereinabove described, the lower thin film 5 and the upper thin film 6 form the sensor portion 3 having the capacitor structure opposed through the cavity 20 of the small interval L1.

In this Si microphone 1, the lower thin film 5 is provided in contact with the upper surface 29 of the Si substrate 2. When a sound pressure (sound wave) is input in the sensor portion 3, therefore, the lower thin film 5 remains unvibrating, and the sensor portion 3 outputs an electric signal responsive to a change of the capacitance of the capacitor structure resulting from vibration of the upper thin film 6. The upper and lower thin films 6 and 5 do not simultaneously vibrate upon the input of the sound pressure (sound wave) in the sensor portion 3, whereby the input sound wave can be inhibited from resonance. Further, the lower thin film 5 is provided in contact with the Si substrate 2, and no cavity is formed between the lower thin film 5 and the Si substrate 2. Therefore, the structure of the sensor portion 3 is simple, and the shock resistance of the sensor portion 3 can be improved.

The Si microphone 1 has no cavity between the Si substrate 2 and the lower thin film 5, whereby no sacrificial layer may be formed between the Si wafer W1 and the lower thin film 5 for forming a cavity in the steps of producing the Si microphone 1. Further, no through-hole may be formed in the Si wafer W1 for removing such a sacrificial layer from a space between the Si wafer W1 and the lower thin film 5. Therefore, the steps of producing the Si microphone 1 can be simplified.

The lower thin film 5 has the plurality of recesses 11 and the plurality of lower through-holes 12, whereby Al employed as the material for the sacrificial layer 34 enters the lower through-holes 12 and the recesses 11 in formation of the sacrificial layer 34. In the sacrificial layer 34, therefore, the recesses 35 and 40 are formed on the positions opposed to the recesses 11 (lower through-holes 12). The recesses 35 and 40 are formed in the sacrificial layer 34, whereby the third insulating layer 15 formed on the sacrificial layer 34 partially enters the recesses 35 and 40. The portions entering the recesses 35 and 40 become the protrusions 17 protruding toward the recesses 11 (lower through-holes 12) after the formation of the cavity 20 resulting from the removal of the sacrificial layer 34.

The protrusions 17 are so formed on the Si microphone 1 as to come into contact with the lower thin film 5 when the upper and lower thin films 6 and 5 are attracted to each other due to electrostatic force or the like, whereby the upper and lower thin films 6 and 5 can be prevented from coming into contact with each other over a wide contact area. Consequently, the upper and lower thin films 6 and 5 can be prevented from adhering to each other.

Figure 3:
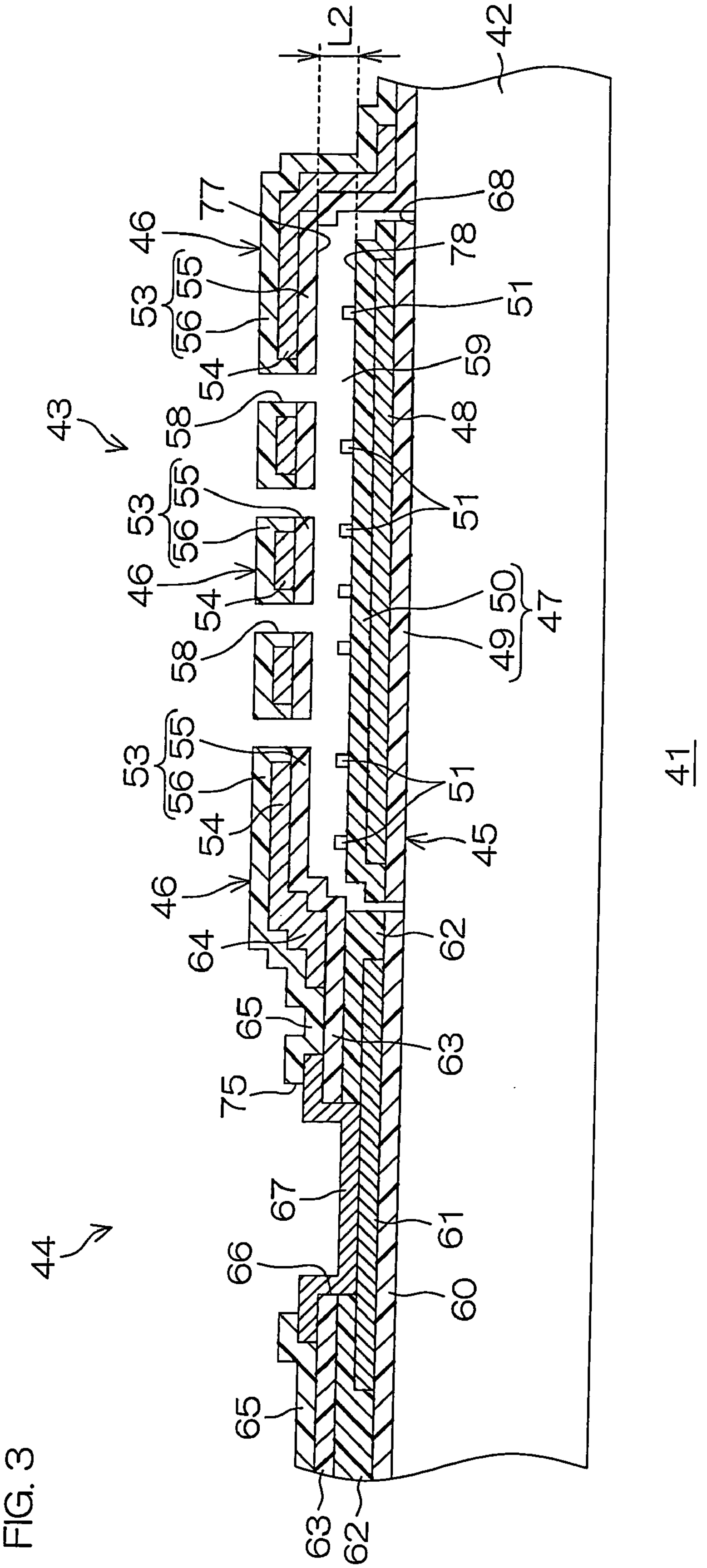
FIG. 3 is a schematic sectional view of an Si microphone according to a second embodiment of the present invention.

FIG. 3 is a schematic sectional view of an Si microphone 41 according to a second embodiment of the present invention.

The Si microphone 41 is a capacitance type sensor (MEMS sensor) operating by sensing a change in capacitance. This Si microphone 41 has a sensor portion 43 and a pad portion 44 on an Si substrate 42.

The sensor portion 43 senses a sound pressure input in the Si microphone 41, and outputs a change of capacitance responsive to the magnitude of the sound pressure to a wire 61 (described later) as an electric signal.

The sensor portion 43 includes a lower thin film 45 provided in contact with a surface (hereinafter referred to as an upper surface 68) of the Si substrate 42 and an upper thin film 46 arranged above the lower thin film 45 to be opposed thereto at an interval.

The lower thin film 45 includes a lower thin film insulating layer 47 and a lower electrode 48 covered with the lower thin film insulating layer 47.

The lower thin film insulating layer 47 is rectangularly formed in plan view, and includes a first insulating layer 49 forming a lower layer of the lower tin film insulating layer 47 and a second insulating layer 50 formed on the first insulating layer 49 as an upper layer of the lower thin film insulating layer 47. The lower thin film insulating layer 47 is provided with no through-holes, such as the lower through-holes 12 formed in the lower tin film insulating layer 7 according to the first embodiment, passing through the lower thin film insulating layer 47 in the thickness direction.

The first insulating layer 49 is formed integrally with a first insulating layer 60 (described later) of the pad portion 44.

The second insulating layer 50 is formed integrally with a second insulating layer 62 (described later) of the pad portion 44.

The lower electrode 48 is made of a conductive material such as Au or Al, for example, and Al is applied in this embodiment. The lower electrode 48 is rectangularly formed in plan view. This lower electrode 48 is arranged on the upper surface of the first insulating layer 49. The side surfaces and the upper surface of the lower electrode 48 are covered with the second insulating layer 50. In other words, the lower electrode 48 is held between the lower first insulating layer 49 and the upper second insulating layer 50 in the lower thin film 45, so that the overall surfaces thereof are covered with the lower thin film insulating layer 47.

The upper thin film 46 includes an upper thin film insulating layer 53 and an upper electrode 54 covered with the upper thin film insulating layer 53.

The upper tin film insulating layer 53 includes a third insulating layer 55 forming a lower layer of the upper thin film insulating layer 53 and a fourth insulating layer 56 formed on the third insulating layer 55 as an upper layer of the upper thin film insulating layer 53.

The third insulating layer 55 is formed integrally with a third insulating layer 63 (described later) of the pad portion 44.

The fourth insulating layer 56 is formed integrally with a fourth insulating layer 65 (described later) of the pad portion 44.

The upper thin film insulating layer 53 is provided with a plurality of upper through-holes 58 passing through the upper thin film insulating layer 53 in the thickness direction thereof. The plurality of upper through-holes 58 are arranged in the form of a matrix with m rows and n columns (m and n denote natural numbers) as a whole, for example. Thus, the upper thin film insulating layer 53 is in the form of a rectangular mesh in plan view, with the upper through-holes 58 provided in the form of a matrix in plan view.

The upper electrode 54 is made of a conductive material such as Au or Al, for example, and Al is applied in this embodiment. The upper electrode 54 is in the form of a rectangular mesh in plan view. The upper electrode 54 is arranged on the third insulating layer 55. The side surfaces and the upper surface of the upper electrode 54 are covered with the fourth insulating layer 56. In other words, the upper electrode 54 is held between the lower third insulating layer 55 and the upper fourth insulating layer 56 in the upper thin film 46, so that the overall surfaces thereof are covered with the upper thin film insulating layer 53. The upper electrode 54 is supported by a wire 64 (described later) at a prescribed interval from the upper surface of the lower thin film 45 (upper surface 78 of the second insulating layer 50). Thus, the upper thin film 46 formed by covering the upper electrode 54 with the upper thin film insulating layer 53 is opposed to the lower thin film 45 through a cavity 59 of a small interval L2 (the distance between the upper surface 78 of the second insulating layer 50 and the lower surface 77 of the third insulating layer 55 is 4 μm, for example).

A plurality of (seven in FIG. 3) protrusions 51 (lower protrusions) are provided on the upper surface 78 (surface opposed to the upper thin film) of the second insulating layer 50 in the lower thin film 45. The protrusions 51 are made of Si, for example, and irregularly arranged on the upper surface 78 of the second insulating layer 50.

The upper thin film 46 is opposed to the lower thin film 45 through the cavity 59 of the small interval L2, and forms the sensor portion 43 of a capacitor structure whose capacitance changes due to vibration, along with the lower thin film 45. In other words, when a sound pressure (sound wave) is input in the sensor portion 43, the upper thin film 46 vibrates due to this sound pressure, and the sensor portion 43 outputs an electric signal responsive to a change of the capacitance of the capacitor structure resulting from this vibration of the upper thin film 46 to the wire 61 (described later).

The pad portion 44 outputs the electric signal received from the sensor portion 43 to an external wire.

The pad portion 44 includes the first insulating layer 60, the wire 61, the second insulating layer 62, the third insulating layer 63, the wire 64 and the fourth insulating layer 65.

The first insulating layer 60 is formed on the upper surface 68 of the Si substrate 42.

The wire 61 is formed on the first insulating layer 60 in a prescribed pattern. The wire 61 is formed integrally with the lower electrode 48 and electrically connected with the wire 64 on an unshown position.

The second insulating layer 62 is formed on the first insulating layer 60, and covers the wire 61 along with the first insulating layer 60.

The third insulating layer 63 is formed on the second insulating layer 62.

The wire 64 is formed on the third insulating layer 63 in a prescribed pattern. The wire 64 is formed integrally with the upper electrode 54, and electrically connected with the wire 61 on an unshown position.

The second and third insulating layers 62 and 63 are provided with an opening 66 passing through these layers 62 and 63 in the thickness direction thereof. The opening 66 is formed to partially expose the wire 61 as a bonding pad.

A metal thin film 67 covering the part of the wire 61 exposed from the opening 66 is formed on the opening 66. The metal thin film 67 is made of a conductive material such as Au or Al, for example, and Al is applied in this embodiment. An electric wire (not shown) for electrically connecting the Si microphone 41 with an external IC chip (not shown) processing the electric signal, for example, is connected to the metal thin film 67.

The fourth insulating layer 65 is formed on the third insulating layer 63. The fourth insulating layer 65 is provided with an opening 75 partially exposing the metal thin film 67.

FIGS. 4A to 4H are schematic sectional views successively showing the steps of producing the Si microphone 41 shown in FIG. 3.

Figure 4A:
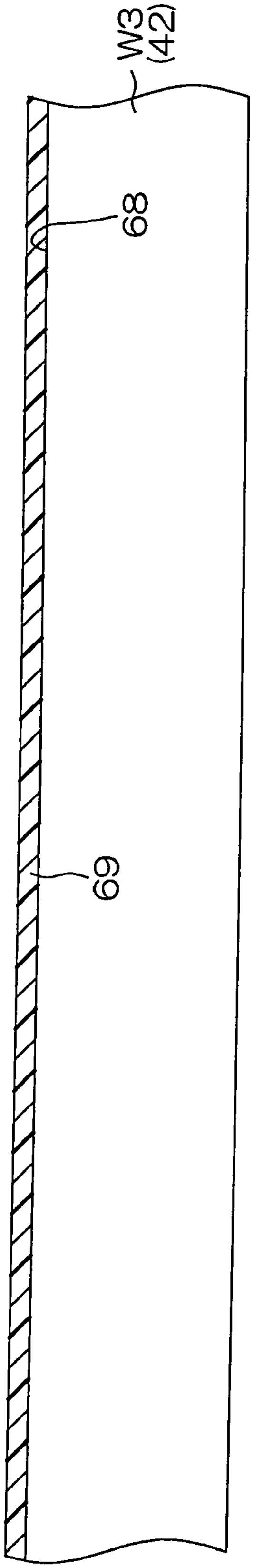
FIGS. 4A to 4H are schematic sectional views successively showing the steps of producing the Si microphone shown in FIG. 3.

In order to produce the Si microphone 41, $SiO_2$ is deposited on a surface (upper surface 68) of a discoidal Si wafer W3 forming the matrix of the Si substrate 42 by PECVD, for example. Thus, a first insulating layer 69 made of $SiO_2$ is formed on the upper surface 68 of the Si wafer W3, as shown in FIG. 4A.

Figure 4B:
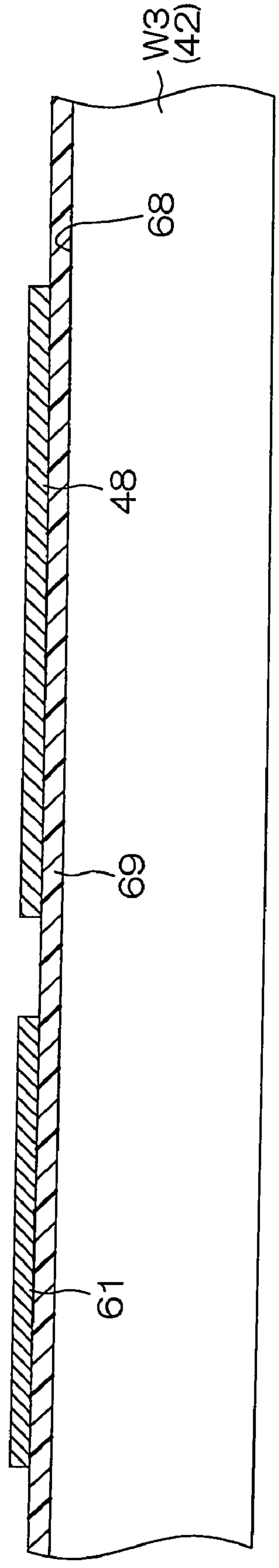

Then, an Al film is formed on the overall region of the first insulating layer 69 by sputtering, for example. Then, this Al film is patterned by well-known photolithography and etching. Thus, the lower electrode 48 rectangular in plan view and the wire 61 of the prescribed pattern are formed on the upper surface of the first insulating layer 69, as shown in FIG. 4B.

Figure 4C:
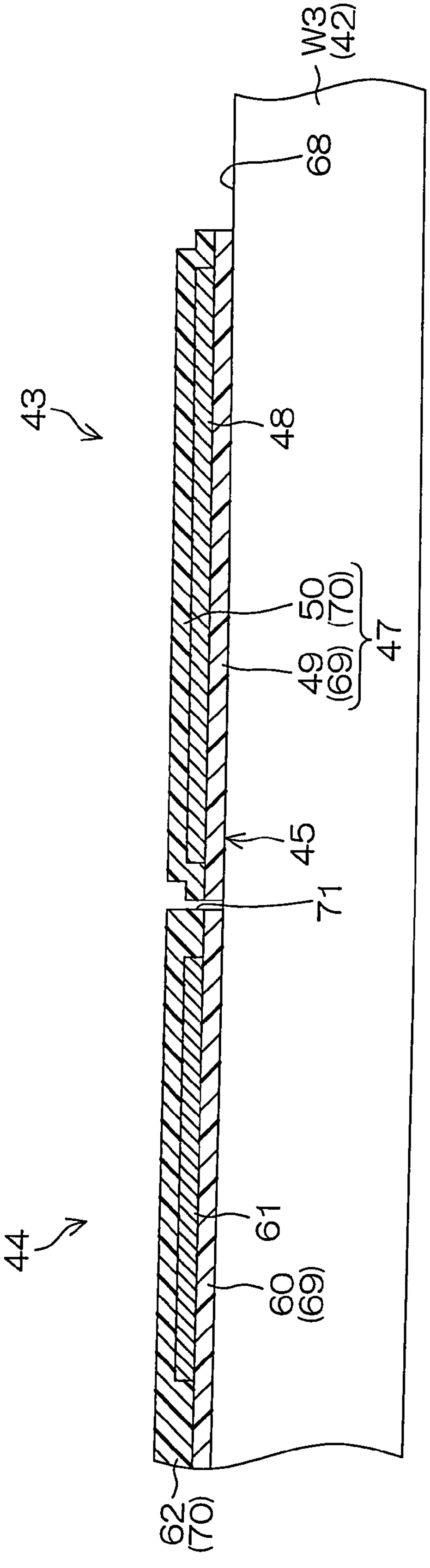

Then, a second insulating layer 70 is formed on the overall region of the first insulating layer 69 including the wire 61 and the lower electrode 48 by PECVD, for example. Then, the second insulating layer 70 and the first insulating layer 69 are patterned by well-known photolithography and etching, to form a clearance 71 dividing the structure provided on the Si substrate 42 into the sensor portion 43 and the pad portion 44. Thus, the first insulating layer 69 in the sensor portion 43 becomes the first insulating layer 49, and the portion of the second insulating layer 70 located on the first insulating layer 49 becomes the second insulating layer 50. The lower thin film 45 having the structure obtained by covering the lower electrode 48 with the lower thin film insulating layer 47 consisting of the first and second insulating layers 49 and 50 is formed in the sensor portion 43 in this manner, as shown in FIG. 4C.

On the other hand, the first insulating layer 69 in the pad portion 44 becomes the first insulating layer 60, and the portion of the second insulating layer 70 located on the first insulating layer 60 becomes the second insulating layer 62 covering the wire 61 along with the first insulating layer 60.

Then, a sacrificial layer material is deposited on the overall region of the Si wafer W3 by PECVD, for example. This sacrificial layer material is made of a mixture of a plurality of types of materials having an etching selection ratio, such as Al—Si (mixture of Al and Si), Al—Si—Cu (mixture of Al, Si and Cu) or a mixture prepared by mixing granular foreign matter into an organic solvent, for example. In this embodiment, Al—Si containing Si in a mixture ratio (volume ratio) of 1% with respect to Al is employed.

Figure 4D:
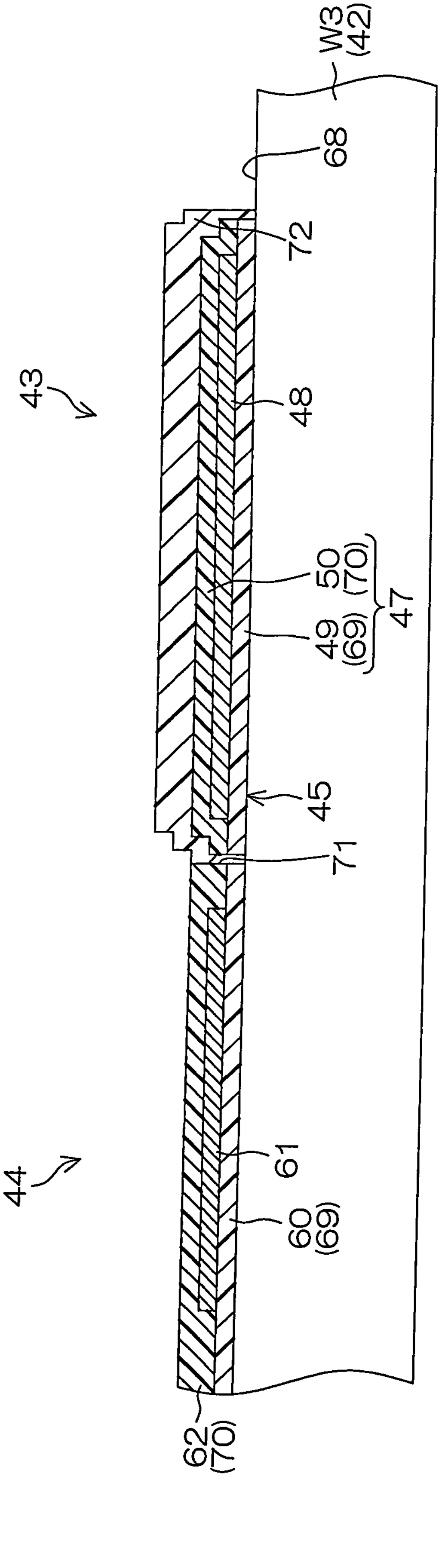

Then, this Al—Si film is patterned by well-known photolithography and etching to form a sacrificial layer 72 made of Al—Si, as shown in FIG. 4D.

Figure 4E:
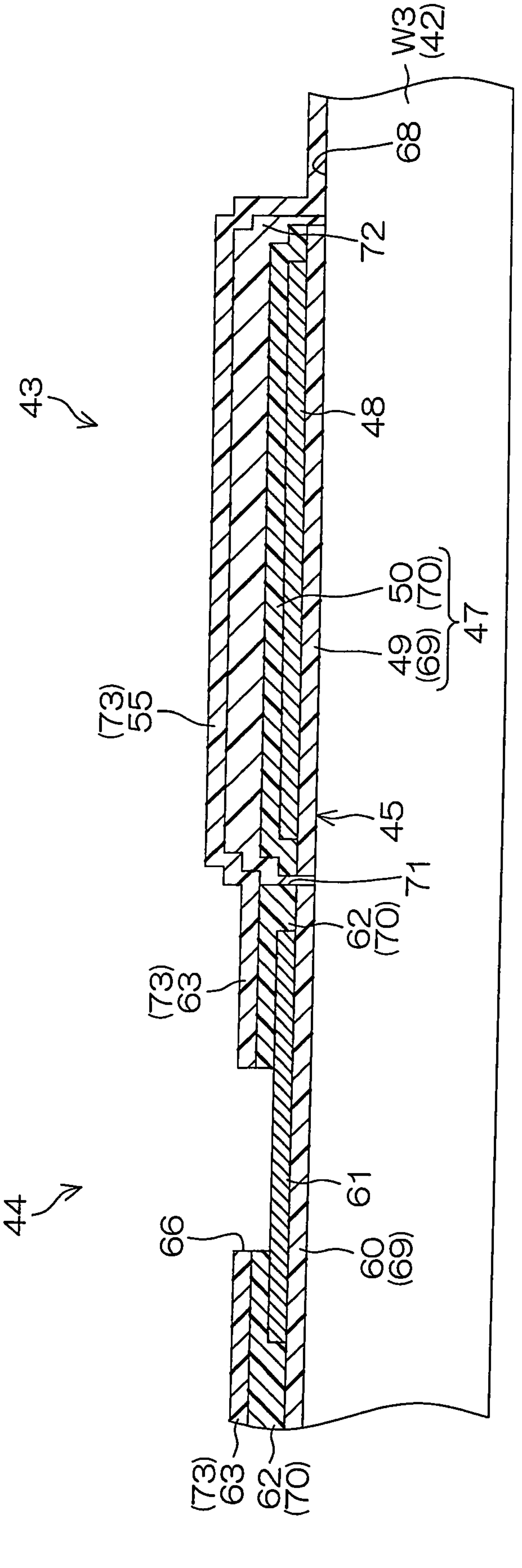

After the formation of the sacrificial layer 72, $SiO_2$ is deposited on the overall region of the Si wafer W3 including the sacrificial layer 72 by PECVD, for example. This $SiO_2$ is deposited up to a height for completely covering the sacrificial layer 72. Thus, a third insulating layer 73 is formed by the third insulating layer 55 provided on the sacrificial layer 72 and the third insulating layer 63 provided on the second insulating layer 62, as shown in FIG. 4E. Thereafter the third insulating layer 63 and the second insulating layer 62 are partially removed by well-known photolithography and etching, for forming the opening 66 partially exposing the wire 61 as the bonding pad.

Figure 4F:
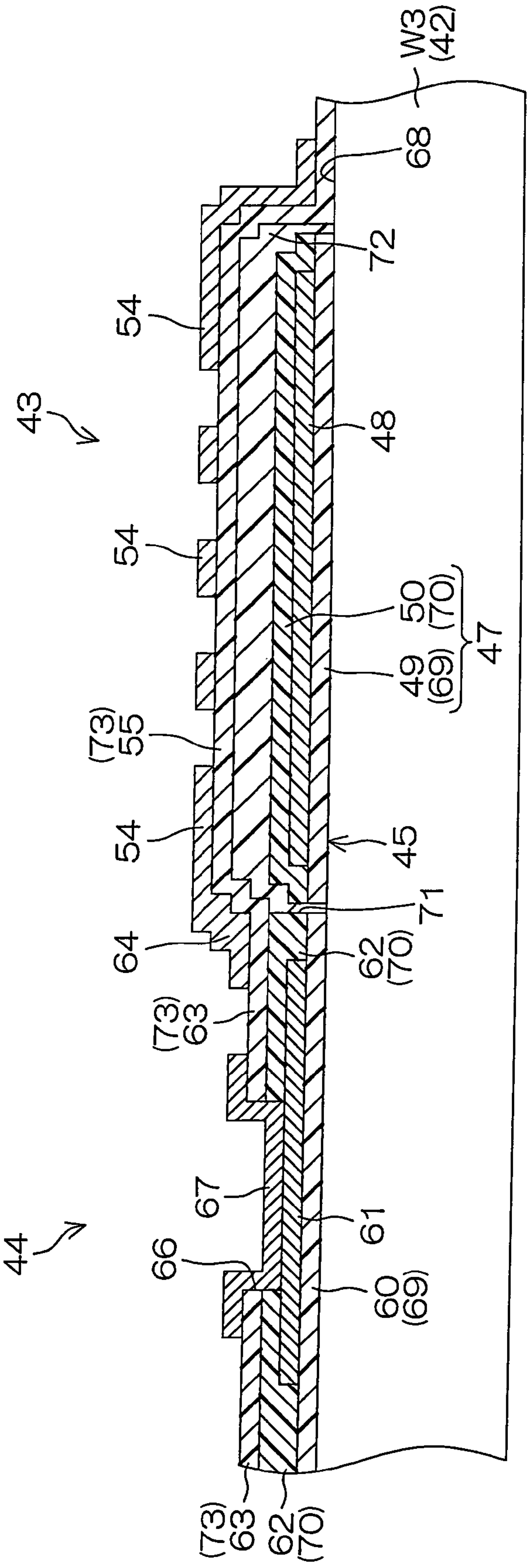

Then, an Al film is formed on the overall region of the third insulating layer 73 by sputtering, for example. Then, the Al film is patterned by well-known photolithography and etching. Thus, the upper electrode 54 in the form of a mesh in plan view is formed on a position of the upper surface of the third insulating layer 55 opposed to the lower thin film 45 through the sacrificial layer 72, as shown in FIG. 4F. On the other hand, the wire 64 of the prescribed pattern is formed on the upper surface of the third insulating layer 63. Further, the metal thin film 67 covering the part of the wire 61 exposed from the opening 66 is formed on the opening 66.

Figure 4G:
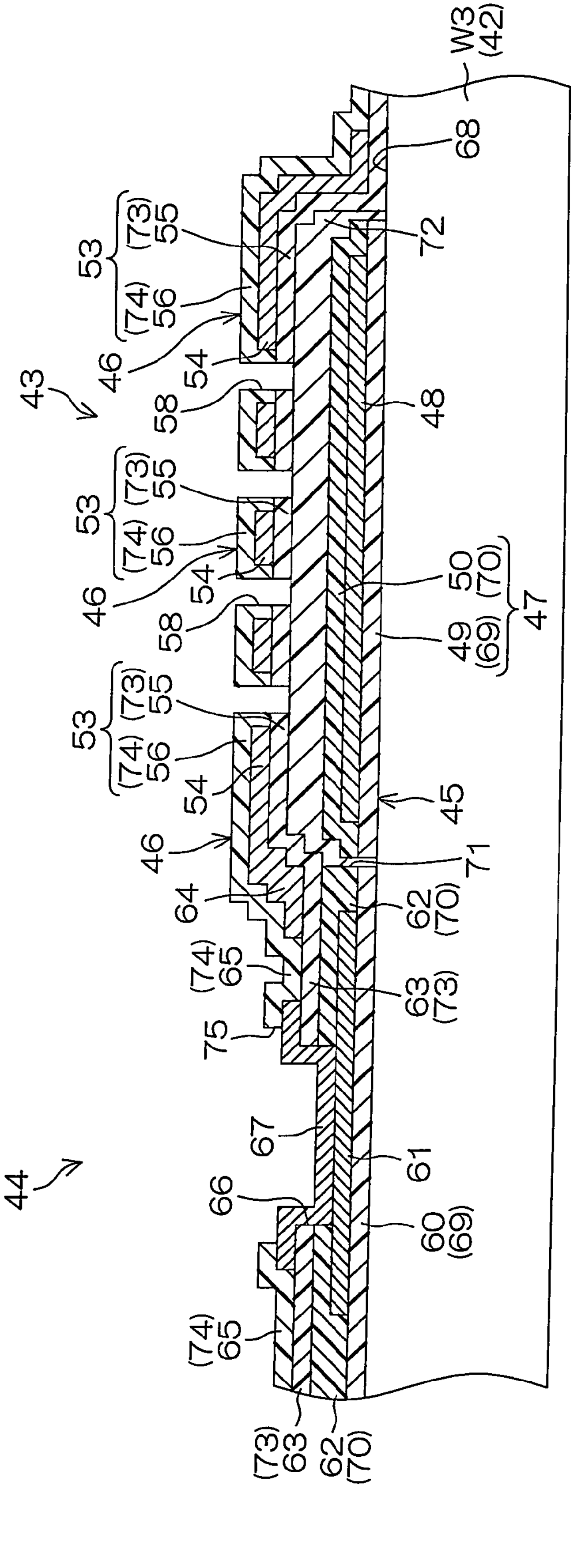

Then, $SiO_2$ is deposited on the overall region of the third insulating layer 73 including the upper electrode 54, the wire 64 and the metal thin film 67 by PECVD, for example. Thus, a fourth insulating layer 74 is formed by the fourth insulating layer 56 provided on the third insulating layer 55 and the fourth insulating layer 65 provided on the third insulating layer 63. Then, the fourth insulating layer 74 and the third insulating layer 73 are patterned by well-known photolithography and etching. Thus, the upper through-holes 58 are formed in the fourth insulating layer 56 and the third insulating layer 55 to extend in the thickness direction thereof up to the sacrificial layer 72, as shown in FIG. 4G. The upper thin film 46 having the structure obtained by covering the upper electrode 54 with the upper thin film insulating layer 53 consisting of the third and fourth insulating layers 55 and 56 is formed on the lower thin film 45 in this manner. Further, the opening 75 exposing the metal thin film 67 is formed in the fourth insulating layer 65.

Figure 4H:
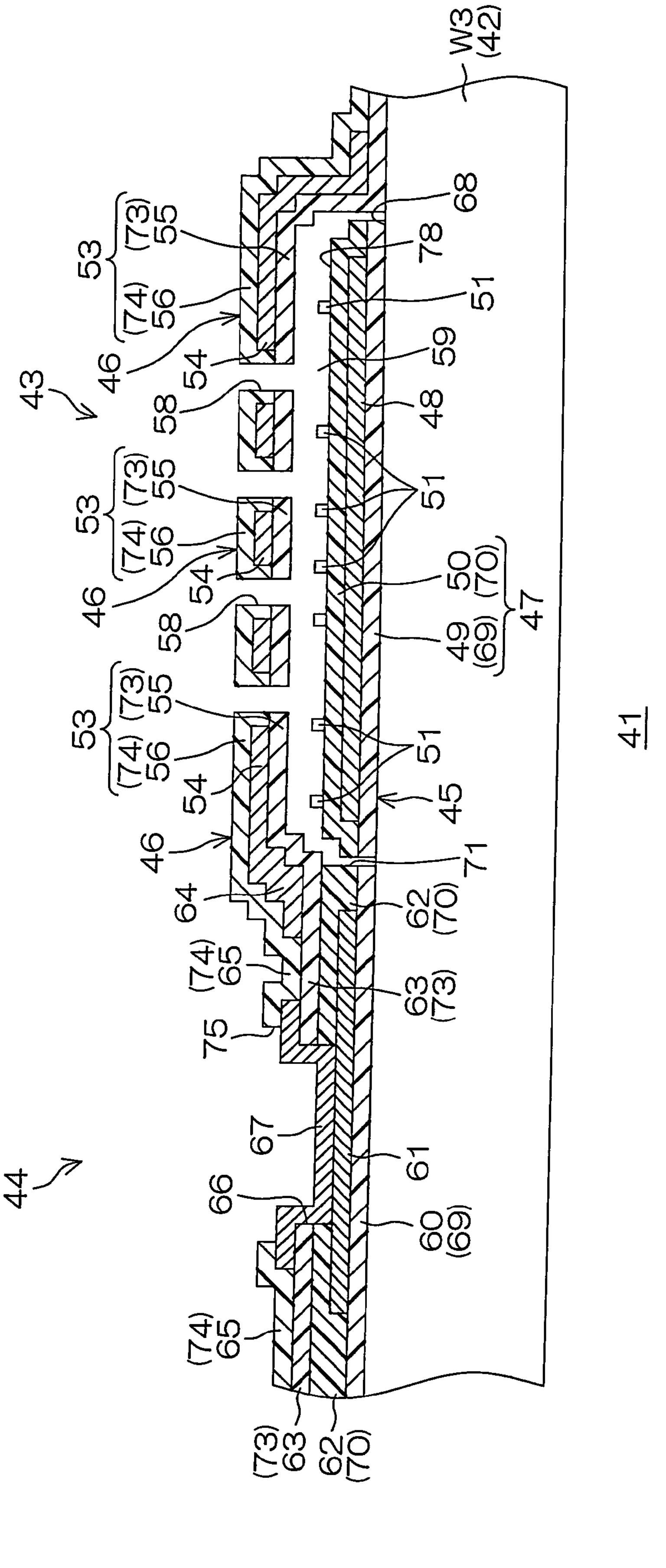
Figure 5A:
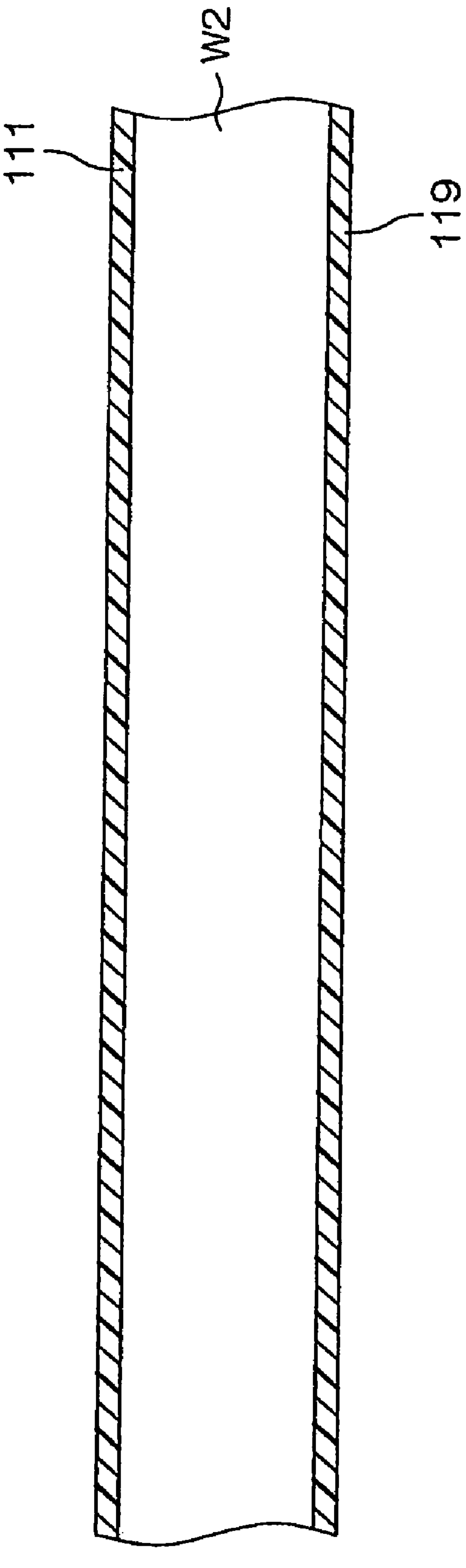
FIG. 5A PRIOR ART
FIGS. 5A to 5K are schematic sectional views successively showing the steps of producing a conventional Si microphone.
Figure 5B:
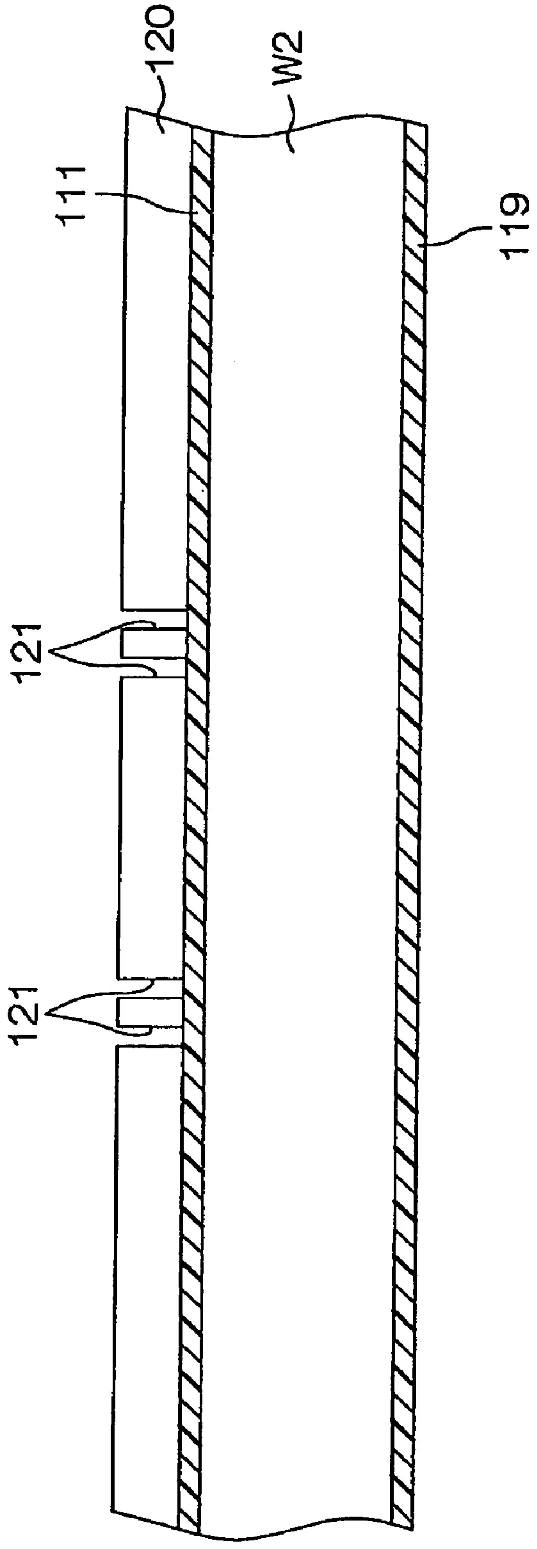
FIG. 5B PRIOR ART
Figure 5C:
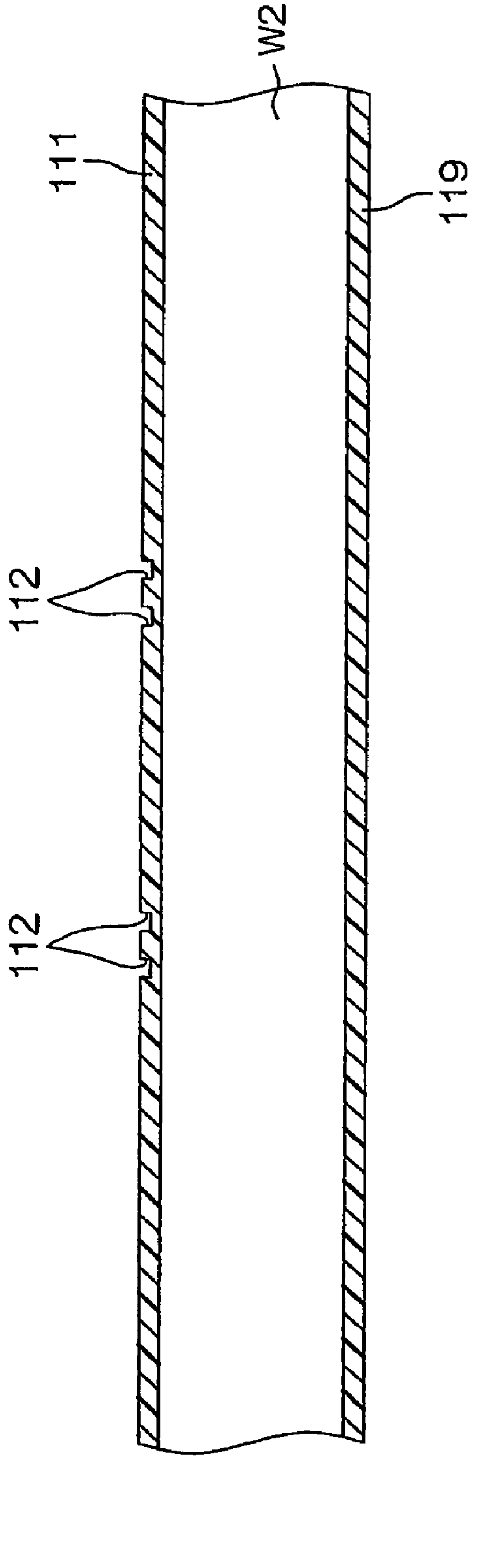
FIG. 5C PRIOR ART
Figure 5D:
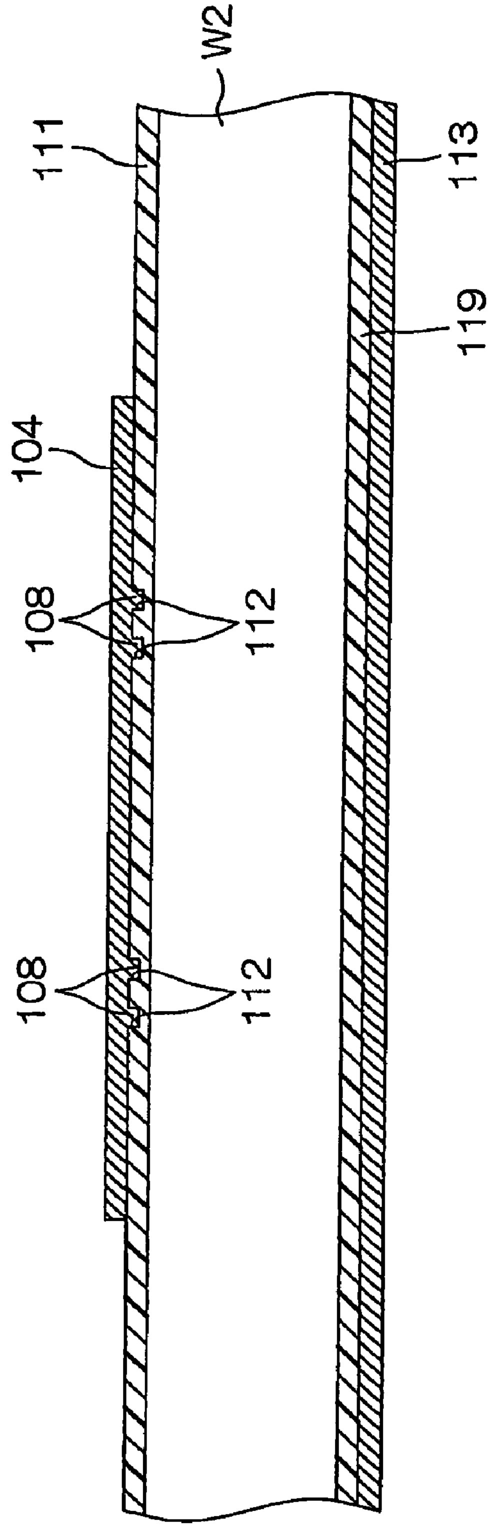
FIG. 5D PRIOR ART
Figure 5E:
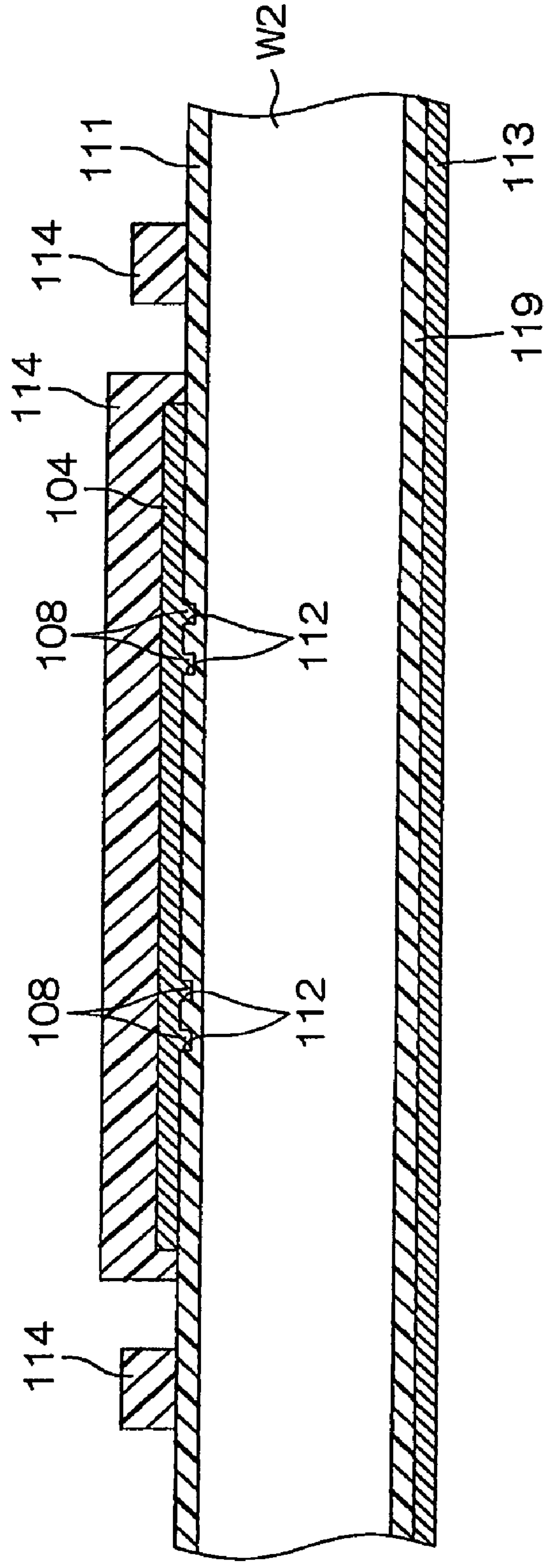
FIG. 5E PRIOR ART
Figure 5F:
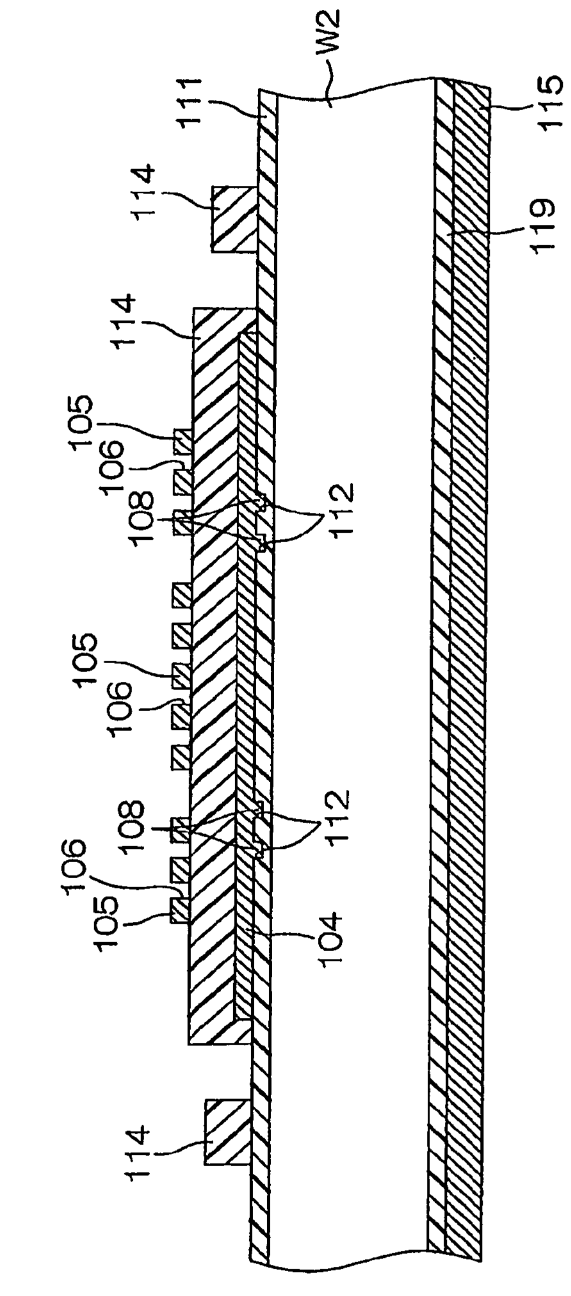
FIG. 5F PRIOR ART
Figure 5G:
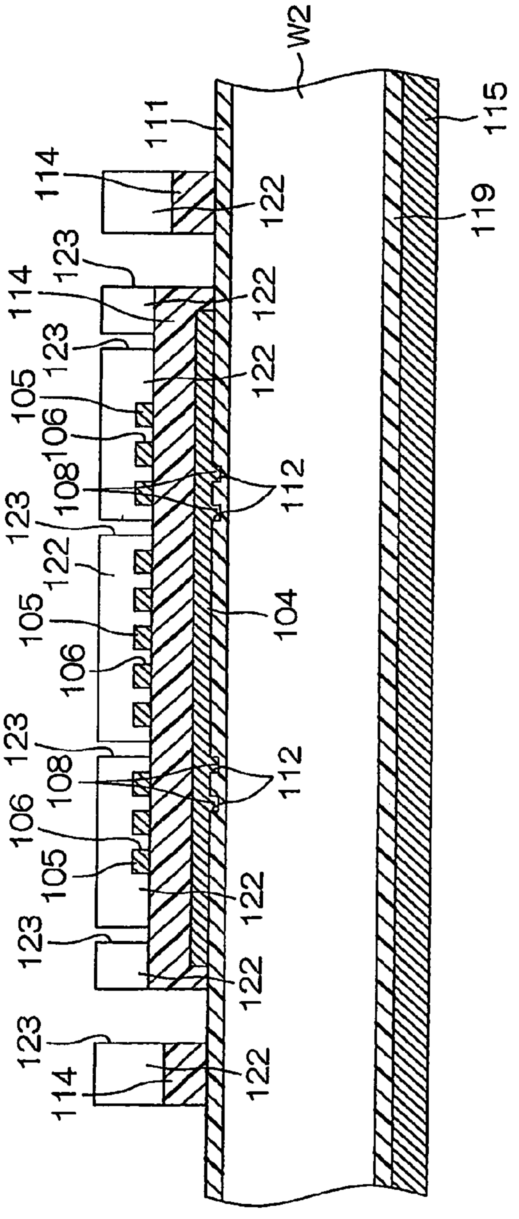
FIG. 5G PRIOR ART
Figure 5H:
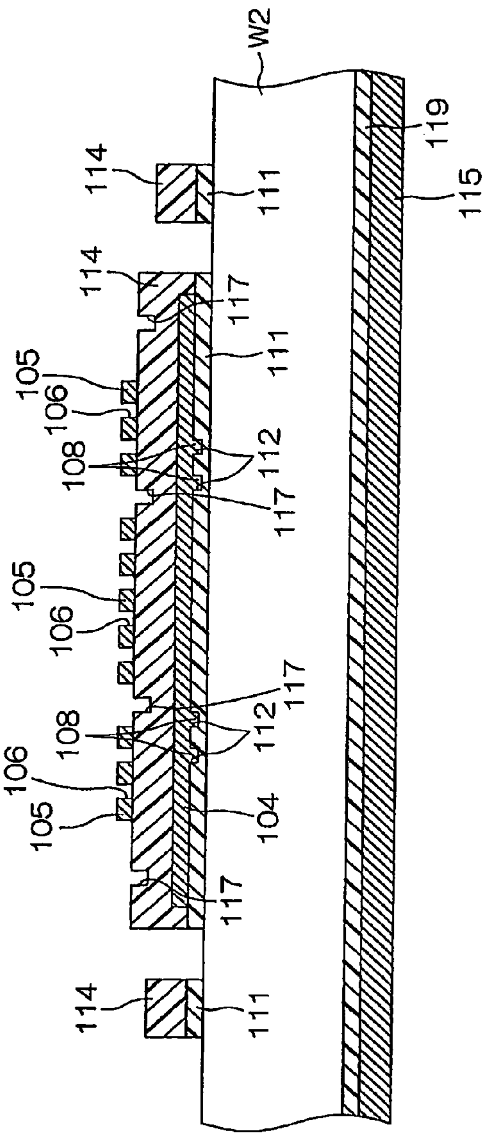
FIG. 5H PRIOR ART
Figure 5I:
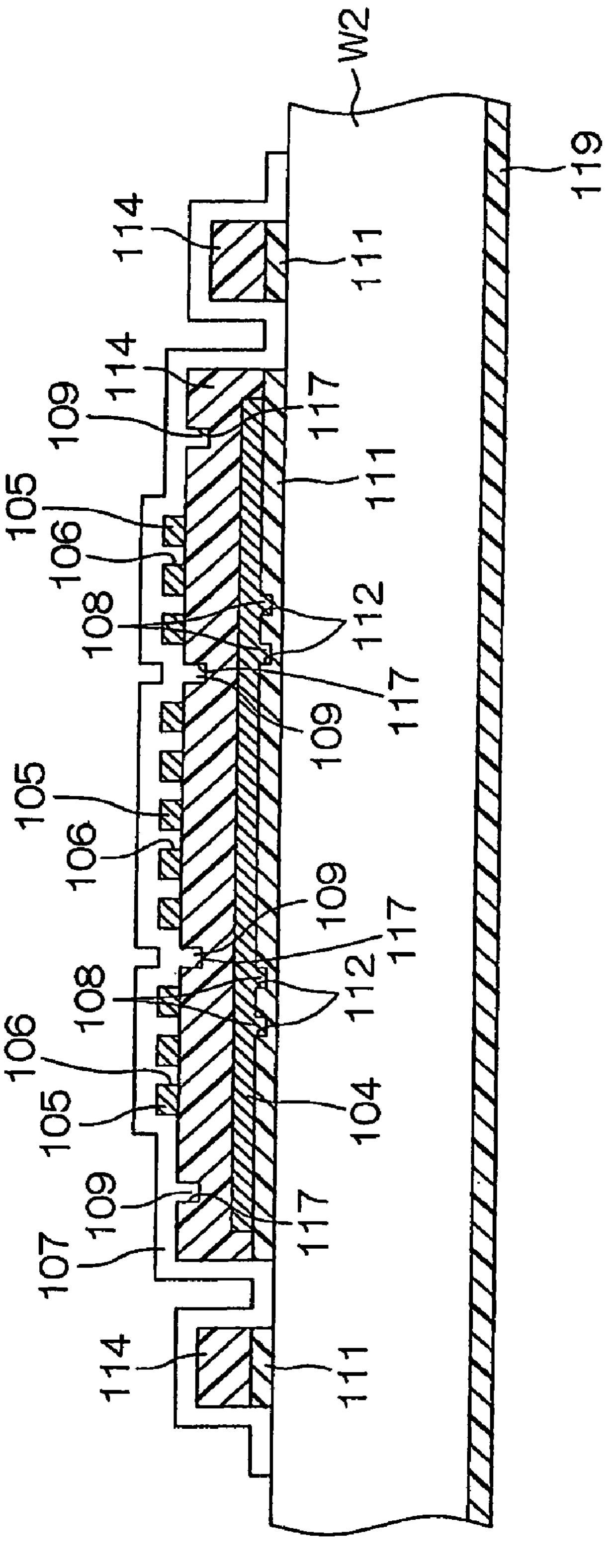
FIG. 5I PRIOR ART
Figure 5J:
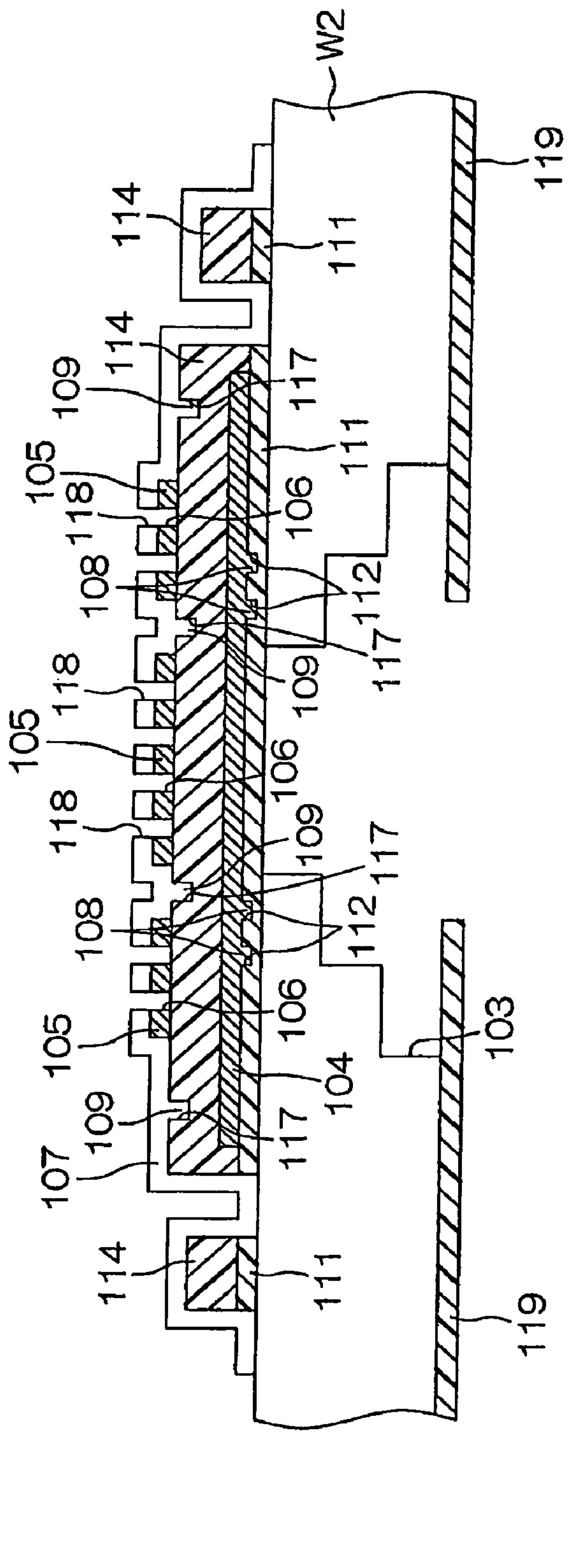
FIG. 5J PRIOR ART
Figure 5K:
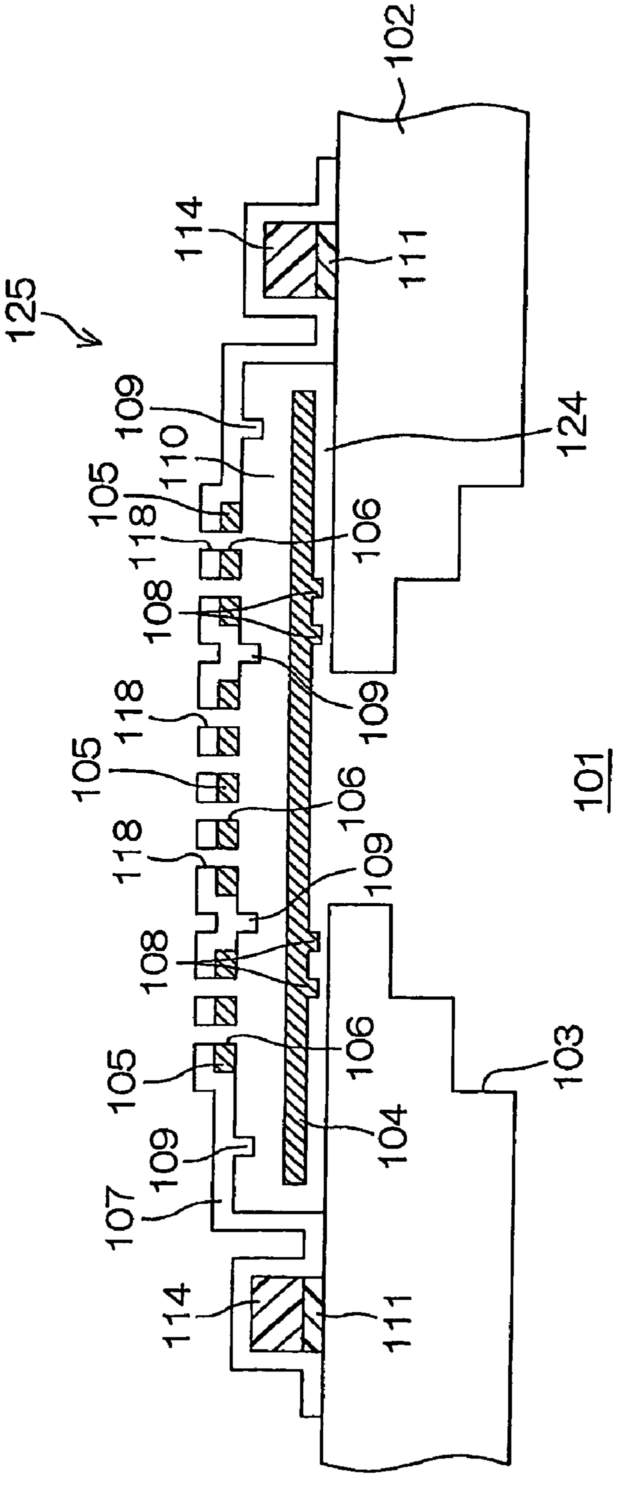
FIG. 5K PRIOR ART

Thereafter etching gas (chlorine-based gas such as $BCl_3$ (boron trichloride), for example) is supplied to the sacrificial layer 72 through the upper through-holes 58. The chlorine-based gas such as $BCl_3$ easily chemically reacts with the Al component contained in Al—Si forming the sacrificial layer 72. Therefore, Al is preferentially etched in the sacrificial layer 72 supplied with the etching gas. After the etching gas is supplied for a prescribed time (necessary for entirely removing the Al component from the sacrificial layer 72, for example), the supply of the etching gas is stopped. Thus, the Al component is removed from the sacrificial layer 72 and the cavity 59 is formed between the lower thin film 45 and the upper tin film 46, while the material other than Al (component other than the Al component: Si in this embodiment) forming the sacrificial layer 72 remains on the upper surface of the lower thin film 45 (upper surface 78 of the second insulating layer 50) as the plurality of protrusions 51, as shown in FIG. 4H.

Then, the Si wafer W3 is divided into the size of the Si substrate 42, whereby the Si microphone 41 shown in FIG. 3 is obtained.

According to the second embodiment, as hereinabove described, the lower thin film 45 and the upper thin film 46 form the sensor portion 43 having the capacitor structure opposed through the cavity 59 of the small interval L2, and the lower thin film 45 is provided in contact with the upper surface 68 of the Si substrate 42. Further, no cavity is formed between the lower tin film 45 and the Si substrate 42. Therefore, functions/effects similar to those of the first embodiment can be attained.

According to the second embodiment, further, the Al component is removed from the sacrificial layer 72, so that the cavity 59 is formed between the lower thin film 45 and the upper thin film 46 and the plurality of protrusions 51 remain on the upper surface of the lower thin film 45 (upper surface 78 of the second insulating layer 50). Therefore, the protrusions 51 come into contact with the upper thin film 46 when the upper thin film 46 and the lower thin film 45 are attracted to each other due to electrostatic force or the like, whereby the upper and lower thin films 46 and 45 can be prevented from coming into contact with each other over a wide contact area. Consequently, the upper and lower thin films 46 and 45 can be prevented from adhering to each other.

While the plurality of embodiments of the present invention have been described, the present invention can also be carried out in other embodiments.

For example, the sacrificial layer 34 may alternatively be made of another material such as SiN (silicon nitride), so far as the material can be etched and has an etching selection ratio with the lower thin film insulating layer 7 and the upper thin film insulating layer 13.

The lower thin film insulating layer 7 or 47 and the upper thin film insulating layer 13 or 53 may alternatively be made of another material such as SiN, for example, so far as the same is an insulating material. When the lower thin film insulating layer 7 and the upper thin film insulating layer 13 are made of a material other than $SiO_2$, the sacrificial layer 34 may be made of $SiO_2$.

The MEMS sensor according to the present invention is not restricted to the Si microphone, but may be applied to a pressure sensor or an acceleration sensor operating by sensing a change in capacitance.

A detailed description has been given of embodiments of the present invention. However, these embodiments are only specific examples used to make apparent the technical features of the present invention, and the present invention should not be interpreted as being limited to these specific examples, and the spirit and the scope of the present invention are limited only by the scope of the appended claims.

The present application corresponds to Japanese Patent Application No. 2007-192203 filed with the Japan Patent Office on Jul. 24, 2007, and all the disclosures thereof are incorporated herein by references.

What is claimed is:

1. An MEMS sensor including:

a substrate;

a lower thin film provided in contact with a surface of the substrate; and an upper thin film opposed to the lower thin film at an interval on the side opposite to the substrate, wherein an entire surface of the lower thin film closer to the substrate is in contact with the surface of the substrate, a plurality of lower through-holes are formed in the lower thin film to pass through the lower thin film in the thickness direction thereof, and the upper thin film is provided with upper protrusions formed integrally with the upper thin film to protrude toward the lower through-holes from the surface of the upper thin film opposed to the lower thin film.

2. The MEMS sensor according to claim 1, wherein the lower thin film is provided with lower protrusions protruding toward the upper thin film on the surface opposed to the upper thin film.

3. The MEMS sensor according to claim 1, wherein the upper thin film is provided with a plurality of upper through-holes passing through the upper thin film in a thickness direction thereof.

4. An MEMS sensor including:

a substrate;

a lower thin film provided in contact with a surface of the substrate; and an upper thin film opposed to the lower thin film at an interval on the side opposite to the substrate, wherein an entire surface of the lower thin film closer to the substrate is in contact with the surface of the substrate, the lower thin film has a lower electrode and a lower thin film insulating layer covering the lower electrode, and the lower thin film insulating layer is in contact with the surface of the substrate.

5. The MEMS sensor according to claim 4, wherein the lower thin film insulating layer has a first insulating layer forming a lower layer of the lower thin film insulating layer and a second insulating layer formed on the first insulating layer as an upper layer of the lower thin film insulating layer, and the first insulating layer is in contact with the surface of the substrate.

6. The MEMS sensor according to claim 5, wherein a plurality of recesses are formed in the second insulating layer.

7. The MEMS sensor according to claim 6, wherein the plurality of recesses are arranged in a form of a matrix.

8. The NEMS sensor according to claim 7, wherein the lower electrode is in a form of a rectangular mesh in plan view.

9. The MEMS sensor according to claim 8, wherein the second insulating layer covers a side surface and an upper surface of the lower electrode, and a surface of the second insulating layer protuberates on portions opposed to the lower electrode and has the recesses in portions not opposed to the lower electrode.

10. The MEMS sensor according to claim 5, wherein a plurality of protrusions are provided on a surface opposed to the upper thin film of the second insulating layer.

11. An MEMS sensor including:

a substrate;

a lower thin film provided in contact with a surface of the substrate; and an upper thin film opposed to the lower thin film at an interval on the side opposite to the substrate;

a sensor portion, having the lower thin film and the upper thin film, arranged to generate an electric signal responsive to a change of capacitance resulting from a vibration of the upper thin film, and a pad portion arranged to output the electric signal generated by the sensor portion to outside, wherein an entire surface of the lower thin film closer to the substrate is in contact with the surface of the substrate, the lower thin film of the sensor portion has a first insulating layer, a lower electrode formed on the first insulating layer, and a second insulating l ayer formed on the lower electrode, the upper thin film of the sensor portion has a third insulating layer, an upper electrode formed on the third insulating layer, and a fourth insulating layer formed on the upper electrode, the pad portion has a first insulating layer, a second insulating layer, a third insulating layer, and a fourth insulating layer, which are laminated from a side of the substrate in this order, and the first insulating layer of the lower thin film and the first insulating layer of the pad portion, the second insulating layer of the lower thin film and the second insulating layer of the pad portion, the third insulating layer of the upper thin film and the third insulating layer of the pad portion, and the fourth insulating layer of the upper thin film and the fourth insulating layer of the pad portion are formed integrally, respectively.

* * * * *